· US009746376B2

(12) United States Patent
Wein

(10) Patent No.: US 9,746,376 B2
(45) Date of Patent: Aug. 29, 2017

(54) APPARATUS AND METHODS FOR HYPERSPECTRAL IMAGING WITH PARALLAX MEASUREMENT

(71) Applicant: EO Vista, LLC, Sudbury, MA (US)

(72) Inventor: Steven J. Wein, Sudbury, MA (US)

(73) Assignee: EO Vista, LLC, Acton, MA (US)

(*) Notice: Subject to any disclaimer, the term of this patent is extended or adjusted under 35 U.S.C. 154(b) by 220 days.

(21) Appl. No.: 14/539,981

(22) Filed: Nov. 12, 2014

(65) Prior Publication Data
US 2015/0136954 A1 May 21, 2015

Related U.S. Application Data

(63) Continuation-in-part of application No. 14/538,804, filed on Nov. 11, 2014, now abandoned.

(60) Provisional application No. 61/902,831, filed on Nov. 12, 2013.

(51) Int. Cl.
G01J 3/28 (2006.01)
G01J 3/36 (2006.01)
G06T 5/00 (2006.01)
H01L 27/146 (2006.01)

(52) U.S. Cl.
CPC ............ *G01J 3/2823* (2013.01); *G01J 3/2803* (2013.01); *G01J 3/36* (2013.01); *G06T 5/006* (2013.01); G01J 2003/2806 (2013.01); G01J 2003/2826 (2013.01); G06T 2207/10036 (2013.01); G06T 2207/30181 (2013.01); H01L 27/14634 (2013.01)

(58) Field of Classification Search
CPC ....... G01J 2003/2806; G01J 2003/2826; G01J 3/2803; G01J 3/2823; G01J 3/36; G06T 2207/10036; G06T 2207/30181; G06T 5/006; H01L 27/14634
See application file for complete search history.

(56) References Cited

U.S. PATENT DOCUMENTS 4,883,962 A 11/1989 Elliott
5,760,899 A 6/1998 Eismann
9,426,397 B2 8/2016 Wein
(Continued)

OTHER PUBLICATIONS

Notice of Allowance for U.S. Appl. No. 14/539,983, entitled: Apparatus and Methods for Hyperspectral Imaging With On-Chip Digital Time Delay and Integration, dated Apr. 27, 2016.
(Continued)

Primary Examiner — Francis M Legasse, Jr.
(74) Attorney, Agent, or Firm — Hamilton, Brook, Smith & Reynolds, P.C.

(57) ABSTRACT

An apparatus and corresponding method for line-scan imaging includes a 2D array of light-sensitive detector elements divided into a plurality of sub-arrays. An electrical circuit can be configured to determine a correction for parallax based on detector element values from at least two rows of parallax detecting elements to enable images captured by the sub-arrays to be co-aligned with each other. The 2D array and parallax detecting elements can be located on the same substrate chip. Image data from sub-arrays can be co-aligned with each other based on parallax data from the parallax detecting elements and used to produce hyperspectral images corrected for parallax.

56 Claims, 14 Drawing Sheets

(56) References Cited

U.S. PATENT DOCUMENTS

| | | | |
|---|---|---|---|
| 2007/0292046 A1* | 12/2007 | Johnson | G02B 13/18 382/275 |
| 2009/0051793 A1* | 2/2009 | Smith | H04N 5/2351 348/266 |
| 2010/0214654 A1* | 8/2010 | Birk | G01J 1/44 359/385 |
| 2011/0181553 A1* | 7/2011 | Brown | G06F 3/0425 345/175 |
| 2011/0243384 A1* | 10/2011 | Tamaru | H04N 13/0022 382/103 |
| 2015/0136955 A1 | 5/2015 | Wein | |

OTHER PUBLICATIONS

Tyrrell, B., et al., "Design Approaches for Digitally Dominated Active Pixel Sensors: Leveraging Moore's Law Sealing in Focal Plane Readout Design," *Proc. of SPIE*, 6900 (2008).

* cited by examiner

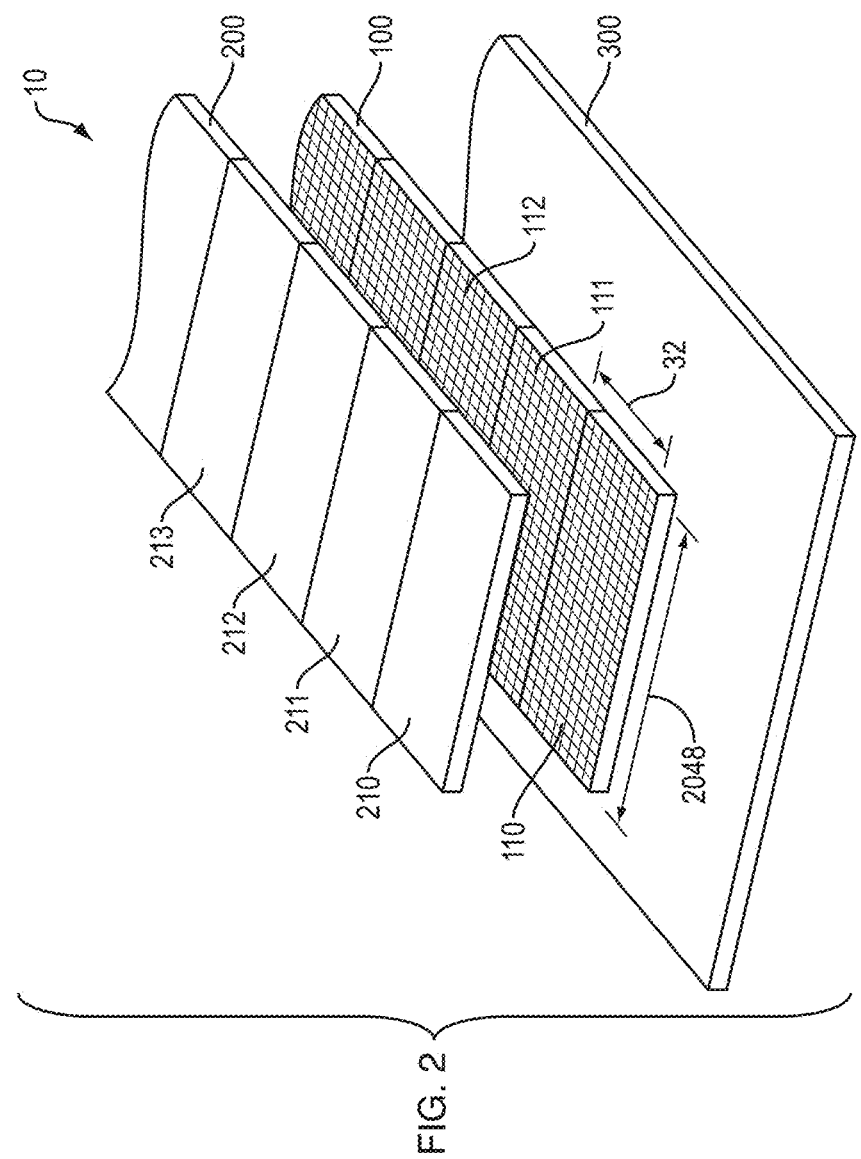

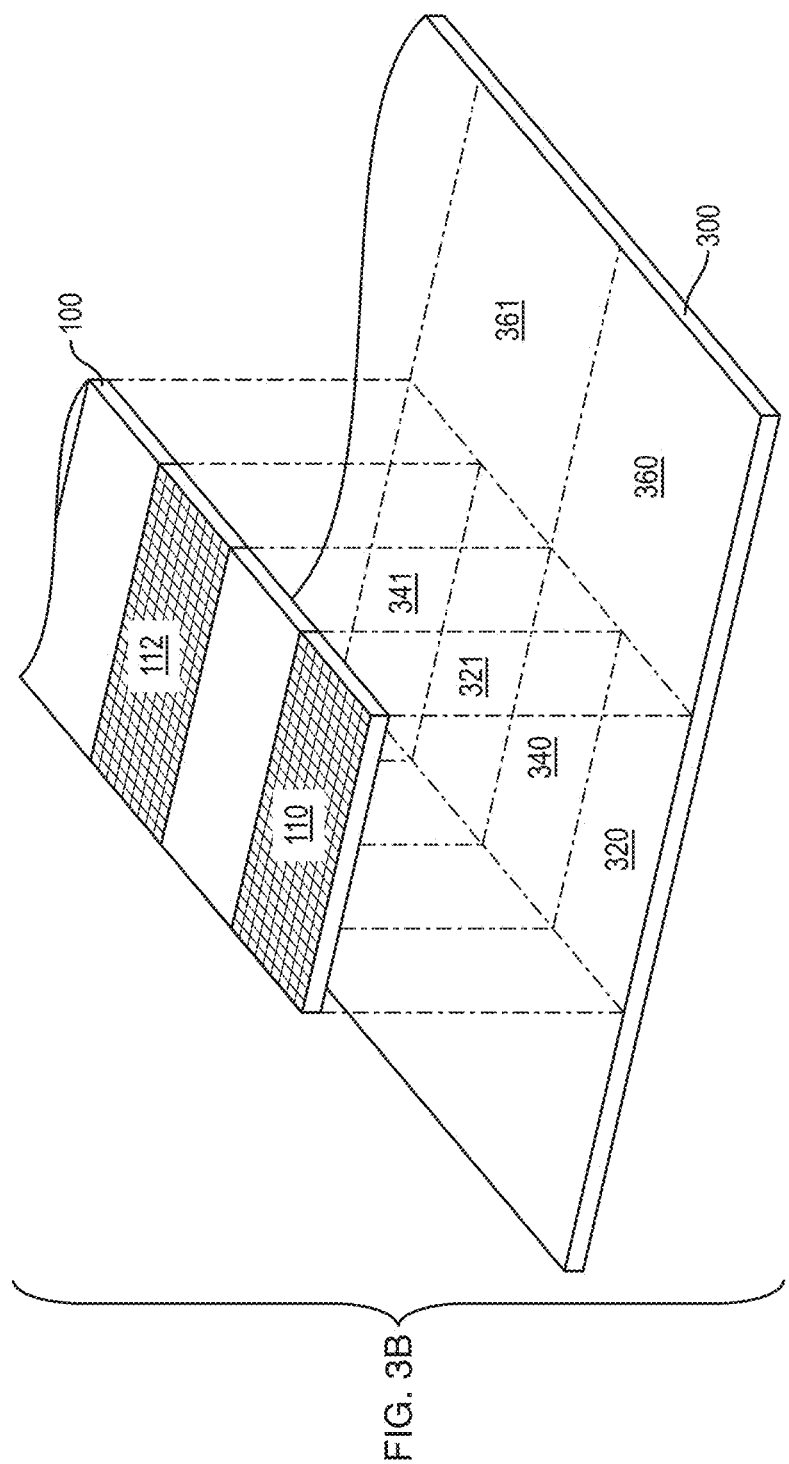

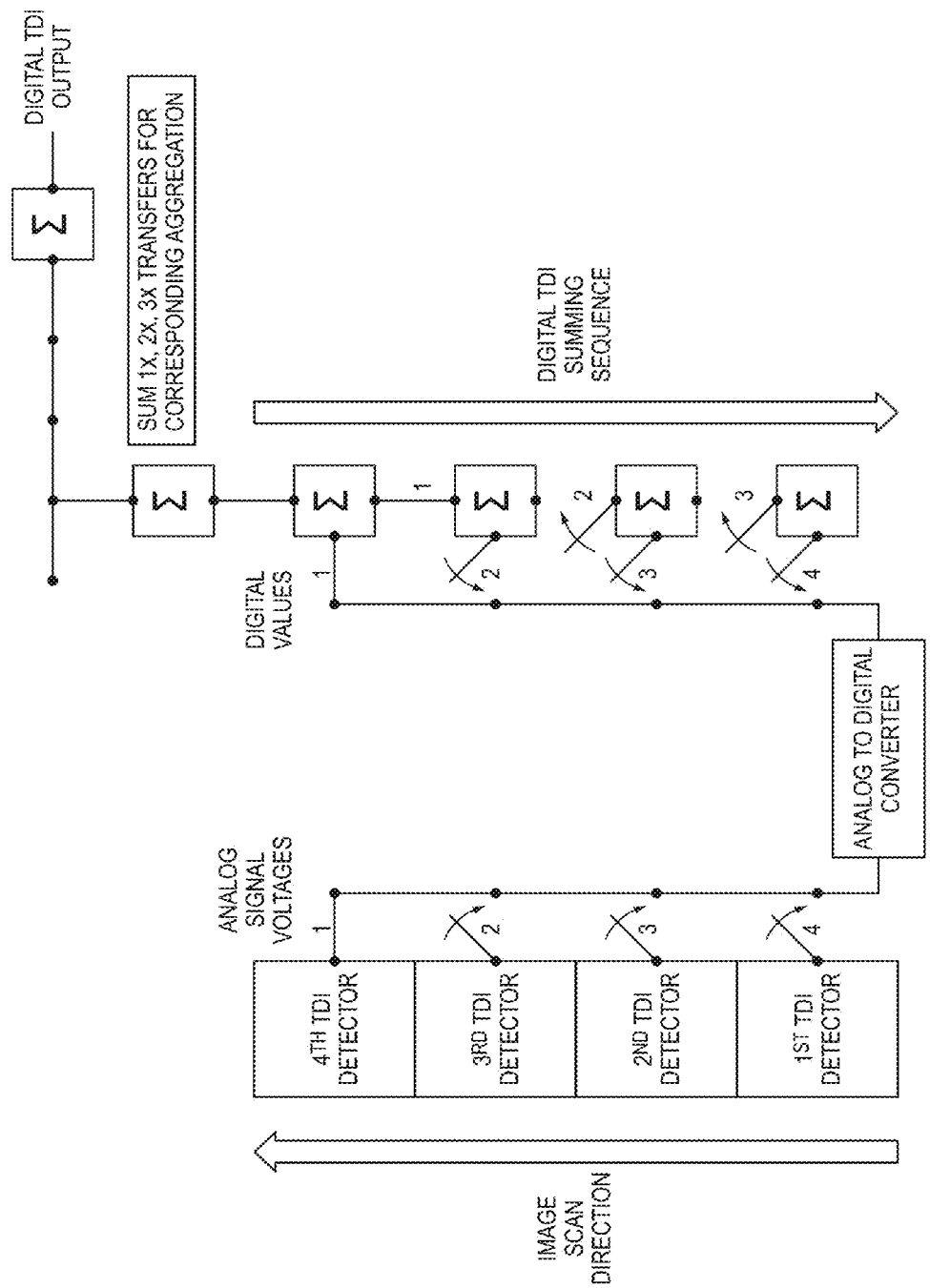

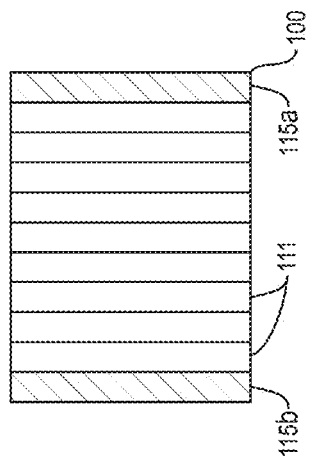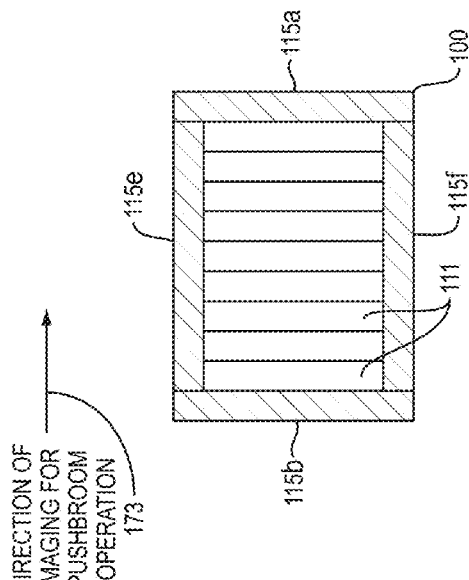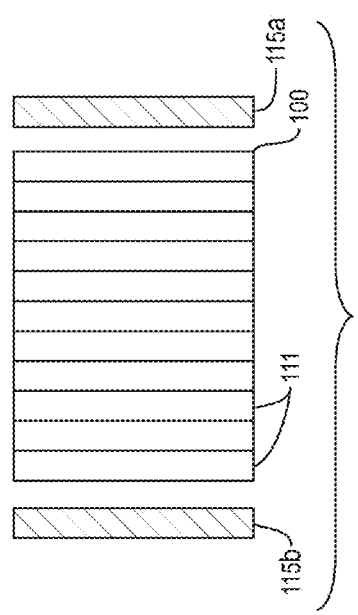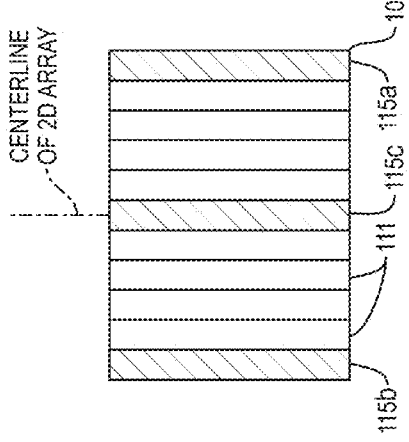

APPARATUS AND METHODS FOR HYPERSPECTRAL IMAGING WITH PARALLAX MEASUREMENT

RELATED APPLICATION

This application is a continuation-in-part of U.S. application Ser. No. 14/538,804, filed Nov. 11, 2014, which claims the benefit of U.S. Provisional Application No. 61/902,831, filed on Nov. 12, 2013. This application also claims the benefit of U.S. Provisional Application No. 61/902,831, filed on Nov. 12, 2013. The entire teachings of the above applications are incorporated herein by reference.

BACKGROUND

Embodiments of the present invention generally relate to the field of spectrally resolved imaging systems and, more specifically, to extending the imaging range and/or improving the signal-to-noise ratio of spatially scanning "hyperspectral" imaging systems.

Accurate measurement of spectral signatures requires sensing an image in many narrow spectral bands, also referred to herein as channels. Since each spectral channel is so narrow, each channel accumulates relatively small signals. The lower the signal levels, the lower the achievable imaging range between object and sensor. Longer imaging range is improved by collecting more signal.

Most hyperspectral sensors are scanning systems that image an object in one dimension through a narrow slit onto a sensing array while spreading out the spectrum of each point along the slit in a direction orthogonal to the slit using a prism or grating. These slit spectrometers are typically operated in a "pushbroom" scan mode. They operate by continuously scanning a single line of pixels across the scene. The light is passed through the slit and dispersed into its constituent colors by either a diffraction grating or prism within the optical spectrometer. Exposure time (i.e., signal collection time) for each pixel is extremely limited.

One method to increase the signal level in a slit based spectrometer is to increase the size of the collecting optics. Another approach is to give up (i.e., reduce) spatial resolution by allowing the individual pixels to collect more signal from a larger area. Yet another approach is to scan at much slower speeds or to backscan. Lastly, dual-slit spectrometers have been proposed.

For non-spectrometer, line scan imaging systems, benefits of Time-Delay and Integration (TDI) are well known. TDI in line-scanning systems substantially increases the signal-to-noise ratio (SNR) and results in greatly increased imaging ranges, scanning speeds, and detection sensitivities, or various combinations thereof. In the visible region of the electromagnetic spectrum, analog, two-dimensional charge-coupled devices (CCDs) based upon silicon detector technology are very commonly utilized for TDI line-scanners. Signal charges from along-scan direction pixels are transferred and accumulated from one detector to the next in synchronicity with the image moving across the array. The more stages of TDI, the more signal that is accumulated as the image moves across the array.

In the infrared spectral regime, silicon CCD detectors are not applicable, so digital TDI (dTDI) has been developed. In dTDI, fast framing arrays are utilized. Signals from the individual pixels are digitized at the end of each frame integration period. The digital values from the along-scan-direction pixels, from the current frame, are added to the accumulated value from the previous pixel from the previous frame, tracking the image motion across the array.

SUMMARY

When the signal level in a slit-based spectrometer is increased by increasing the size of the collecting optics, the size and weight of the system are considerably increased. Allowing the individual pixels to collect more signal from a larger area comes at the expense of spatial resolution. Scanning at much slower speeds and backscanning can result in reduced scan area coverage and can produce gaps in coverage. Dual-slit spectrometers come at the expense of more complicated optical spectrometer assemblies, and they achieve only twice the signal level.

Embodiments of the present invention relate to a solid state imaging sensor that can provide both high spectral resolution and high spatial resolution. High spectral resolution can be achieved without spectrally-dispersive elements, such as prisms and diffraction gratings. Embodiments can determine and correct for distortion, such as parallax distortion, using image data from the same chip as used for imaging. Both a 2D array of detector elements for hyperspectral imaging and detector elements for detecting parallax data can be located on a common detector substrate. A digital time delay and integration (TDI) circuit can be located outside of a detector-pixel-supporting portion of a detector substrate containing a read-out integrated circuit (ROIC) to allow pixel size to be reduced to a state-of-the-art size. Viewed in an alternative way, portions of the ROIC are directly connected to, and physically and electrically directly support, the 2D array; the TDI can be situated in other portions of the ROIC not supporting the 2D array.

An example embodiment apparatus for line-scan imaging, and corresponding method, includes a 2D array of light-sensitive detector elements configured to detect light from a target scene to be imaged. The 2D array is divided into a plurality of sub-arrays. An electrical circuit can be configured to determine a correction for parallax based on detector element values from at least two rows of parallax detecting detector elements to enable images captured by the sub-arrays to be co-aligned with each other.

Embodiments can also include co-alignment circuitry configured to co-align image data from the sub-arrays to correct for the parallax, and the parallax can be due to a height-, range-, or velocity-dependent distortion. The parallax detecting elements and the detector elements of the 2D array may have respective pitches, and the pitch of the parallax detecting elements can be at least two times smaller than the pitch of the detector elements of the 2D array.

The electrical circuit can be hardware that may include a processor configured to execute software or firmware to co-align the images captured by the sub-arrays with each other as a function of the correction for parallax. The circuit can further be configured to determine topographical-features of the target scene as a function of the parallax. The electrical circuit can also be configured to determine the correction for parallax by at least one of cross-correlation, edge detection, or image matching using the detector element values. The circuit can be further configured to correct for temporal pointing errors measured by a Global Positioning System (GPS), Inertial Navigation System (INS), or Inertial Measurement Unit (IMU) system, or an integrated combination thereof. In some embodiments, the electrical circuit is further configured to correct for lens distortion using lens calibration data.

The 2D array and the at least two rows of parallax detecting elements can be situated in a common plane on a single chip. The rows of parallax detecting elements can also be situated at opposing sides of the 2D array, the opposing sides situated at or near leading and trailing edges of the 2D array with respect to a direction of imaging. The opposing sides of the 2D array can be first opposing sides, and the apparatus can also include two additional rows of parallax-detecting detector elements situated at additional opposing sides of the 2D array. The 2D array can be configured to obtain hyperspectral images of the target scene, and the apparatus can include a plurality of respective, narrowband, optical filter assemblies, each assembly including one or more narrowband, optical filters mounted between the target scene and a respective sub-array. The plurality of optical filter assemblies can include either (i) a plurality of optical filter coatings coated onto a single substrate, or (ii) a plurality of individual spectral filters assembled into a single filter assembly. Two or more broadband optical filters can be disposed to be optically coupled to the parallax detecting elements.

The correction for parallax can be based on detector values from at least three rows of parallax detecting detector elements, and wherein one of the at least three rows is oriented along a centerline of the 2D array, the centerline being nominally perpendicular to a direction of forward motion of the apparatus with respect to the scene to be imaged. Two or more rows of parallax detecting elements can be a corresponding number of the plurality of sub-arrays. The rows of parallax detecting elements can also each be linear arrays (i) adjacent to respective sub-arrays or (ii) separated from respective sub-arrays by respective mechanical gaps.

The apparatus can include a read-out integrated circuit (ROIC) in individual electrical communication with the detector elements of the 2D array. The ROIC can include an analog amplification and signal conditioning electrical circuit module, the module comprising one or more replicated amplification and signal conditioning circuits in one-to-one electrical communication with the detector elements. An analog-to-digital conversion electrical circuit module can be disposed in the ROIC physically adjacent to the analog amplification and signal conditioning electrical circuit module and in a portion of the substrate not supporting the 2D array. The apparatus can include one or more digital Time-Delay and Integration (TDI) modules disposed in the ROIC in a substrate, a part of which supports the 2D array. The TDI modules can particularly be disposed in a portion of the substrate not supporting the 2D array.

The parallax detecting elements can be configured to detect wavelengths in a band of shorter wavelengths than the 2D array is configured to detect. The parallax detecting elements and the elements of the 2D array can be configured to detect light from different respective wavelength bands, the wavelength band corresponding to the parallax detecting elements including shorter wavelengths than the wavelength band corresponding to the elements of the 2D array. The 2D array of light-sensitive detector elements and the parallax detecting elements can be configured to detect light over respective spectral bandwidths, and the spectral bandwidth over which the parallax detecting elements are configured to detect light can be wider than the spectral bandwidth over which the light-sensitive detector elements of the 2D array are configured to be sensitive. The 2D array of light-sensitive detector elements may be sensitive to infrared light or other bands of the electromagnetic spectrum.

An apparatus for line scan imaging can include, on a chip, means for detecting light, from a target seem to be imaged, to produce data representing the target scene. The apparatus can also include, on the chip, means for detecting parallax to use to determine parallax corrections to apply to co-align the data representing the target scene.

An apparatus for line-scan imaging can include a 2D array of light-sensitive detector elements configured to detect light from a target scene to be imaged, and the 2D array can be divided into a plurality of sub-arrays and supported by a portion of a read-out integrated circuit (ROIC) in individual electrical communication with the detector elements of the 2D array. An analog-to-digital (A/D) conversion electrical circuit module can be disposed in a portion of the ROIC not supporting the 2D detector. One or more digital time-delay and integration (TDI) modules can be disposed in the portion of the ROIC not supporting the 2D detector array to perform TDI of individual sub-arrays at the detector elements.

Each of the plurality of sub-arrays can include one row of the 2D array or a plurality of rows of the 2D array. The 2D array of light-sensitive detector elements can be sensitive to infrared light.

An apparatus for line-scan imaging can include a 2D array of light-sensitive detector elements configured to detect light from a target scene to be imaged. The 2D array can be divided into a plurality of sub-arrays and supported by an analog amplification and signal conditioning module portion of a read-out integrated circuit (ROIC), the analog amplification and signal conditioning module including one or more replicated amplification and signal conditioning circuits in individual electrical communication with the detector elements of the 2D array. The apparatus can also include an analog-to-digital (A/D) conversion electrical circuit module disposed in a portion of the ROIC not supporting the 2D array. The apparatus can further include one or more digital time-delay and integration (TDI) modules in the portion of the ROIC not supporting the 2D array, the one or more TDI modules configured to perform TDI of individual sub-arrays of the detector elements.

In some embodiments, each of the plurality of sub-arrays includes one row of the 2D array or a plurality of rows of the 2D array. The 2D array of light-sensitive detector elements can be sensitive to infrared light or to one of long wavelength infrared (LWIR) light, mid wavelength infrared (MWIR) light, or short wavelength infrared (SWIR) light. The 2D array of light-sensitive detector elements can also be sensitive to visible light.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 2 is a perspective, exploded view of the hyperspectral imaging sensor of FIG. 1;

FIG. 3B is a perspective view of a combination of the ROIC of FIG. 3A and an embodiment of the 2D array of FIG. 2B.

FIG. 4 is a schematic block diagram of a time delay and integration (TDI) circuit;

FIG. 11B is a block diagram illustrating a 2D array of light-sensitive detector elements and two physically separate rows of parallax detecting elements;

FIG. 11C is a block diagram illustrating a 2D array of light-sensitive detector elements in which two sets of parallax detecting elements are sub-arrays of the 2-D array situated at opposing ends of the 2D array;

FIG. 11D is a block diagram of a 2D array similar to the 2D array of FIG. 11C but including three sets of parallax detecting elements instead of two;

FIG. 11E is a block diagram illustrating a 2D array of light-sensitive detector elements, with four sets of parallax detecting elements, each set at a different end (e.g., edge) of the rectangular 2D array.

DETAILED DESCRIPTION

Figure 1:
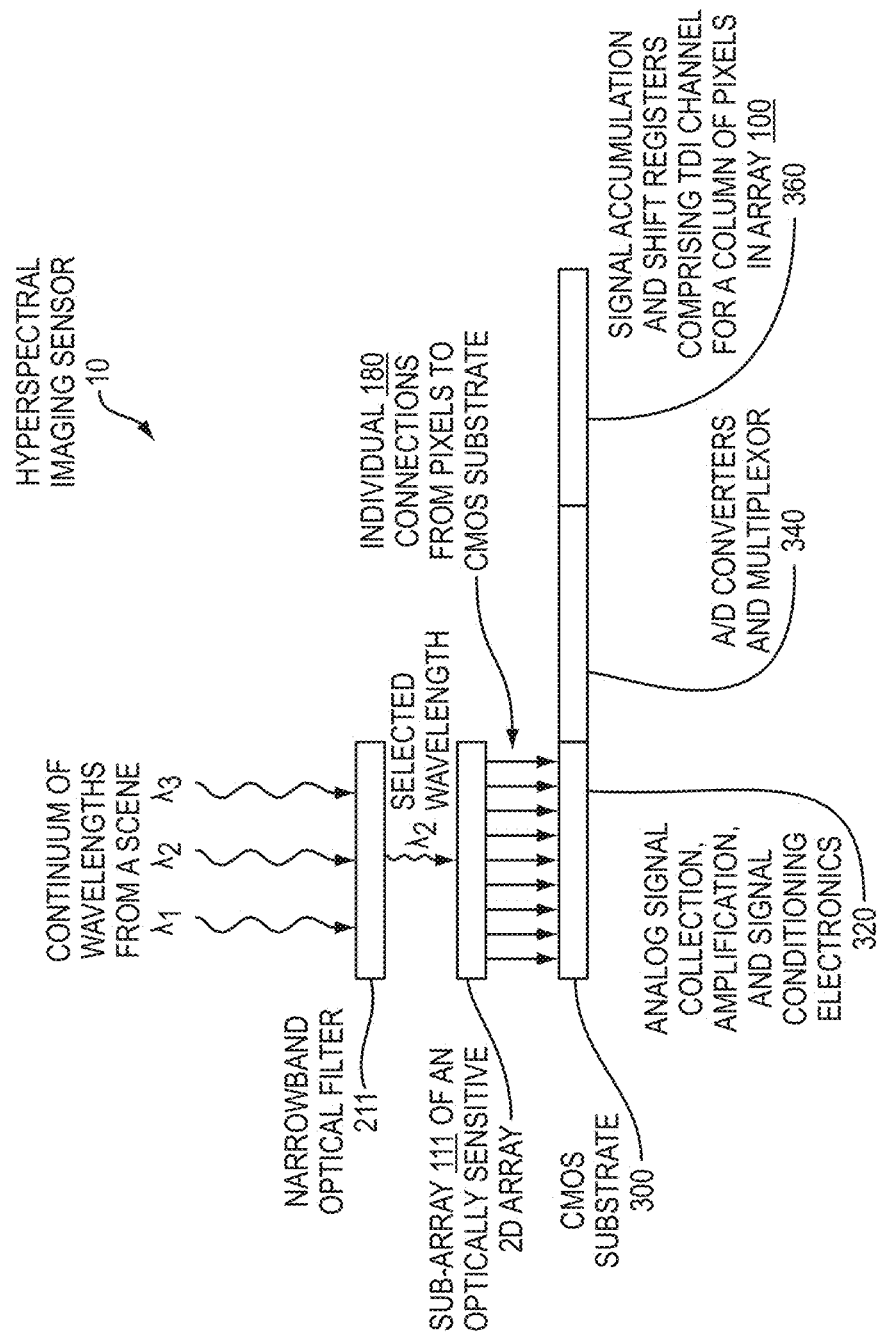
FIG. 1 is a side view of an embodiment of a hyperspectral imaging sensor according to an embodiment of the present intention.

A description of example embodiments of the invention follows.

Described embodiments of the invention are not limited in application to details of construction and arrangement of components set forth in the following description or illustrated in the drawings. The described embodiments are capable of other embodiments and of being practiced or implemented in various ways. Also, the phraseology and terminology used herein is for the purpose of description and should not be regarded as limiting. The use of "including," "comprising," "having," "containing," "involving," and variations thereof herein is meant to encompass the items listed thereafter and equivalents thereof as well as additional items.

FIG. 1 illustrates that a pixel array 100, of which a sub-array 111 is a part, may be electrically coupled to a CMOS substrate 300 on which both analog and digital electrical modules may be fabricated. Each active pixel in the sub-array 111 of the array 100 (illustrated in FIG. 2) has an individual connection 180 to the CMOS substrate 300. Indium bump bonds, for example, are one common method for providing the connections 180 from the active pixels to the CMOS substrate 300. As will be further described hereinafter, the modules may comprise analog signal collection, amplification, and signal conditioning electronics 320, analog-to-digital (A/D) converters and multiplexor 340, and a number of signal accumulation and shift registers, which together comprise a digital Time-Delay and Integration (TDI) channel 360 for each column of pixels in the array 100. FIG. 1 represents a single spectral channel, which is replicated many times to yield the hyperspectral sensor 10, which is illustrated in more detail in FIG. 2.

FIG. 2 is a perspective, exploded view of the hyperspectral imaging sensor 10 illustrated in FIG. 1. FIG. 2 illustrates an embodiment in which the sensor 10 comprises the CMOS substrate 300, on which some or all of the analog and digital circuitry is fabricated, one or more optically sensitive substrates comprising two-dimensional pixel arrays 100, and a striped spectral filter assembly 200 comprising multiple narrowband filters, including the filter 211 shown in FIG. 1, aligned over the respective pixel sub-arrays. The narrowband optical filters 210 to 213 can each be considered an optical filter assembly. The array 100 is thus divided into a plurality of sub-arrays, including the sub-array 111, covered by one or more rectangular, narrowband optical filters 211, where each optical filter selects a narrow band of wavelengths centered at a particular wavelength, $\lambda_2$ for example, from a continuum of wavelengths in a natural scene.

In other embodiments, the optical filter assemblies are individual spectral filters assembled into a single filter assembly. In the embodiment shown in FIG. 2, the optical filters 210 to 213 are optical filter coatings coated onto a single substrate using conventional lithographic techniques. Furthermore, while the parallax-detecting elements are not shown in FIG. 2, they can be placed at leading and trailing edges (sometimes referred to herein as ends or sides) of the 2D array, for example, adjacent to the sub-arrays, such as the sub-array 110. Thus, the filter assembly 200 can also include broadband filters configured to filter light directed toward the parallax-detecting elements, and the broadband filters can similarly be either lithographically deposited optical filter coatings coated onto the same substrate as the narrowband filters or separate broadband filters integrated into the same optical filter assembly 200 as the narrowband filters. The optical filter assemblies are mounted between the target scene and respective sub-arrays of the 2D array 100.

In some embodiments, the overall single filter assembly, which may include a plurality of individual spectral filter assemblies, is mounted directly onto the 2D array 100. In other embodiments, some space can be tolerated between the filter assembly 200 and the 2D array 100. Typically, any gap or distance between the two assemblies is small to ensure that light sensed at each sub-array corresponds to only light filtered by a single optical filter assembly. It should also be noted that the 2D array 100 and the parallax-detecting elements can be configured to detect light over different, respective, spectral bandwidths. This can be done, for example, by making the 2D array 100 and the parallax detecting elements from different types of pixels, or, in appropriate circumstances, it can include simply configuring the filter assembly 200 to have narrowband and or broadband filters of the correct bandwidths. In particular, the parallax-detecting elements can be configured to detect light over a wide spectral bandwidth to increase signal-to-noise ratio and resolution of parallax measurement and correction. Thus, the total spectral bandwidth at which the parallax-detecting elements are configured to detect light can be significantly larger than a spectral bandwidth over which the light-sensitive detector elements of the 2D array are configured to be sensitive.

Typically, the optically sensitive, two-dimensional pixel arrays 100 are each conventionally fabricated optical detector arrays and are grouped (divided) into one or more two-dimensional sub-arrays, such as sub-arrays 110, 111, and 112 illustrated in FIG. 2. The individual detectors may be patterned with conventional photolithographic techniques into the individual sub-arrays, and the sub-arrays may be patterned into a monolithic substrate of an optically-sensitive material. In some embodiments, the arrays 100 comprise Mercury-Cadmium-Telluride (MCT) detectors. In other embodiments, Indium Antimonide (InSb) or nBn barrier materials may be used, for instance, if sensing optical wavelengths above approximately 5 microns in wavelength is not required.

Each of the multiple 2D pixel sub-arrays 110, 111, 112, etc. may be configured to operate as a line scan focal plane; that is, the final output of the sub-array is a one-pixel high by N-pixel long "slice" of the image formed by the optical front end to which the sensor is attached. In the illustrated, example embodiment, this slice is 2048 pixels wide, as indicated in FIG. 2 as the width of a first sub-array 110. An entire two-dimensional image is built up by scanning the image across this one-pixel high line sensor and stacking the line images. The 2048 pixel dimension is called the cross-track direction, while the one pixel dimension is the along-track direction. As is well known in the art of line scan imaging, the line read-out rate of the sensor is synchronized with the scanning rate of the image across the sensor to minimize image blur.

Time-delay and integration (TDI) is a known technique in the imaging art. TDI is a technique for increasing the effective exposure time for a line array sensor without slowing down the rate at which the image scans across the detector. In a TDI system, additional lines of detectors are located immediately adjacent to the original, one-pixel-high line array in the along-track direction. Each additional line is a TDI stage. A TDI sensor operates by accumulating the signals generated along the columns of detectors as a point in the image passes from one line to the next.

In the visible spectrum, analog charge-coupled devices (CCDs) based upon silicon detector technology are very commonly utilized for TDI line-scanners. The analog signal charge is transferred and accumulated from one detector to the next in synchronicity with the image moving across the array. The more stages of TDI, the more signal that is accumulated as the image moves across the array. Silicon CCDs are not optically sensitive in the infrared, so digital TDI and fast framing arrays sensitive to the infrared are utilized. The same functionality described above for CCDs is replicated in the digital domain. The signals from the individual pixels are digitized. The digital signals are then summed up from the previous pixel from the previous frame in time, to track the image motion across the array. As illustrated in FIG. 2, the example hyperspectral imaging sensor according to an embodiment of the invention has a height of 32 lines, for example. As will be described hereinafter in conjunction with FIG. 3A-B, one variation of this embodiment populates only half of those lines with detectors for TDI. The latter embodiment, in FIGS. 3A-B, leaves a gap of 16 lines, for example, between detector sub-arrays to minimize optical cross-talk from one spectral channel to the next and to provide space on the CMOS substrate for analog-to-digital conversion (ADC) and electrical transmission lines.

Referring again to the example embodiment of FIG. 2, the first sub-array 110 is covered by a first rectangular, narrowband optical filter 210, converting sub-array 110 into a narrowband sensor. Further, the pixel array 100 comprises multiple sub-arrays 111, 112, etc., each of which being covered by additional rectangular, narrowband optical filters 211, 212, etc., respectively. Each narrowband optical filter is centered at a different wavelength such that, in the aggregate, the sub-arrays of pixel array 100 record a wideband image with high spectral resolution.

Figure 3A:
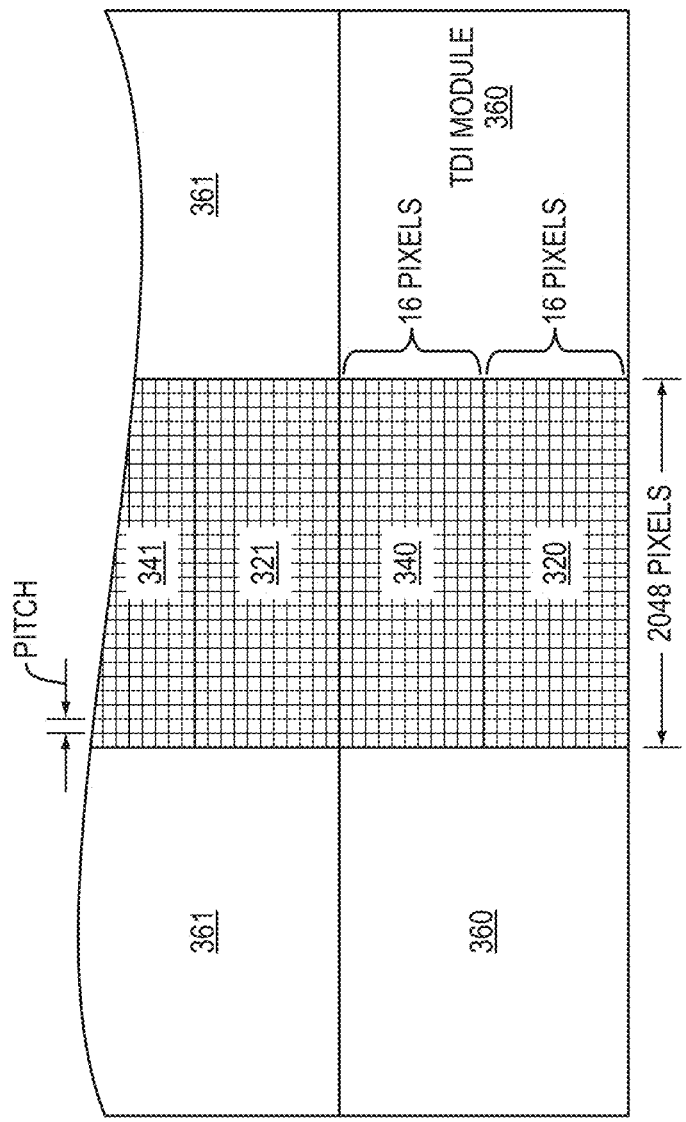
FIG. 3A is a plan view of a readout integrated circuit (ROIC)

Unlike CCDs, the pixels of the detector array in hyperspectral imaging sensor 10 are read out through individual analog read-out circuits, digitized, and then TDI-processed in parallel TDI channels, one channel for each pixel across the array's width, and FIGS. 3A and 3B illustrate these circuits.

FIG. 3A is a plan view illustrating a configuration of hybrid circuits, collectively the Readout-Integrated-Circuit (ROIC), on the CMOS substrate 300 illustrated in FIGS. 1 and 2. The ROIC comprises an analog collection, amplification and signal conditioning (CASC) module 320, which provides each detector pixel with its own analog "micro" input circuit physically located beneath the pixel, in the orientation of FIG. 3A. Each input circuit captures, collects, and holds a voltage proportional to the signal (i.e., the photo-generated charge) from its respective detector. In one embodiment, a very well-vetted Capacitive Trans-Impedance Amplifier (CTIA) is used. As indicated in FIG. 3A, CASC module 320 is a grid of N×M micro-input circuits, where, in one example embodiment, N is 2048, the number of pixels across the width of the embodiment's pixel array, and M is 16, half the number of available pixel sites in height of the array. The remaining ROIC real-estate under pixel sub-array 110, an area equal to 16×2048 pixels, comprises the analog-to-digital converter and multiplexor module 340.

As illustrated in FIG. 1 and, more particularly, in FIG. 3A, the analog-to-digital converter (ADC) and multiplexor module 340 is located immediately adjacent to the CASC module 320 in the reserved 16-pixel high area. This region is used to perform ADC and to switch and route the digital signals out to the sides of the ROIC for digital TDI processing. It will be noted that the 50:50 active-pixel-to-passive pixel design feature makes the hyperspectral imaging sensor design scalable. If the width of the imaging line is increased beyond the example 2048, for example, the widths of CASC module 320 and ADC and multiplexor module 340 increase equally, making room for additional circuits use to support extra active pixels. If the number of TDI stages (i.e., rows of active pixels) increases beyond the example 16, the number of rows in CASC module 320 and ADC and multiplexor module 340 increase equally to support the additional pixels.

As further illustrated in the embodiment of FIG. 3A, the ROIC may also comprise purely digital TDI channels 360, which are disposed in the CMOS substrate 300 to either or both sides of the analog and hybrid regions (that is, the CASC module 320 and ADC and multiplexor module 340). In some embodiments, the TDI modules is split between the two sides of the substrate 300, as in FIG. 3A, to reduce the data transmission length between ADC and multiplexor module 340 elements and their respective TDI module 360 elements From an engineering perspective, the need for infrared imagers to operate at cryogenic temperatures makes it useful for the hyperspectral imaging sensor 10 to perform the TDI function on-chip rather than external to a cryogenic dewar. The on-chip digital TDI provides, in the example embodiment, a 16-times reduction in the number of signal wires leaving the chip and exiting the dewar, thereby providing a significant enhancement over prior approaches.

As previously described, the substrate 300 may comprise an ROIC that includes analog amplification and signal conditioning electrical circuit modules. Each module may comprise one or more replicated amplification and signal conditioning circuits in one-to-one electrical communication with the detector elements of each sub-array. It should also be noted from FIG. 3A that the A/D converter and multiplexer modules 340 and 341, respectively, are physically adjacent to respective analog amplification and signal conditioning electrical circuit modules 320 and 321. Furthermore, as illustrated more clearly in FIG. 3B, the analog-to-digital conversion and electrical circuit modules 340 and 341 are in portions of the substrate 300 not supporting the 2D array.

FIG. 3B is a perspective view of the embodiment of FIG. 3A that further clarifies the relationship between the 2D array 100 and the substrate 300. In particular, a difference between the 2D arrays shown in FIG. 2 and in FIG. 3B is that a spacing of 16 pixels, for example, is left between adjacent sub-arrays 110 and 112 in FIGS. 3A and 3B. As previously described, this configuration reduces or minimizes optical crosstalk between adjacent sub-arrays. The optical filter assembly 200 in FIG. 2 is not shown in FIG. 3B.

While a separation is shown in FIG. 3B between the substrate 300 and the 2D array 200, this separation is only for clarity in illustrating the figure, and the 2D array 200 is typically mounted directly onto the substrate 300 for operation. As illustrated in FIG. 3B, the TDI circuits 360 and 361 are disposed in portions of the substrate 300 that are not supporting the 2D detector array 100. In contrast, the portions 320 and 321 of the substrate 300 do support sub-arrays 110 and 112 of the 2D array 100. Furthermore, the A/D converter and multiplexer modules 340 and 341 are in portions of the substrate 300 not supporting sub-arrays of the 2D array 100 due to the 16 pixel spacing between the sub-arrays 110 and 112. In contrast, the portions 320 and 321 of the substrate 300 do support the sub-arrays 110 and 112 of the 2D array 100. In this embodiment, the detector elements of the sub-arrays 110 and 112 of the 2D array are in individual electrical communication with the ROIC circuit through the analog signal collection, amplification, and signal conditioning electronics in modules 320 and 321, for example, in the substrate 300.

FIG. 4 schematically illustrates the operation of TDI module 360. For clarity, only 4 of the 16 stages of TDI employed by the example embodiment described above are shown. Each detector pixel from a column of array 110 has a one-to-one relationship with its corresponding digital summation node on the left or right side of ROIC 300. Sequencing the operation of the electronic gates as illustrated in FIG. 4 shifts the digital sum accumulated in one stage up to the next stage with each line-time.

Figure 5:
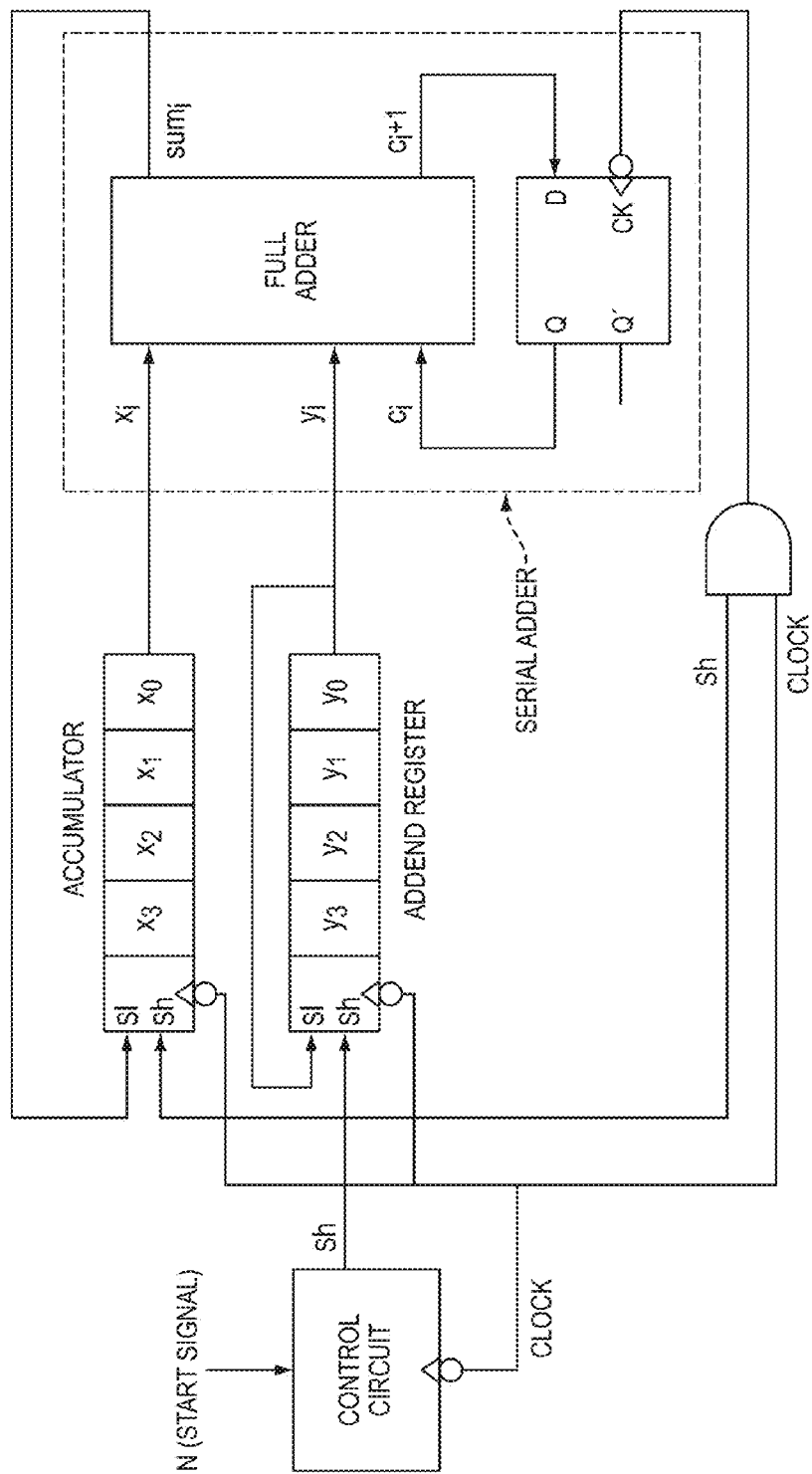
FIG. 5 is a schematic block diagram of summing junction digital logic.

FIG. 5 illustrates an example embodiment of the digital logic in the summing junction. The ADC value from each TDI detector stage is shifted into its corresponding Addend Register and added to an Accumulator register. The accumulator register is available at the output of each stage and transferred to the next stage. After 16 stages of TDI, the total accumulated value is available at the output. Pixel aggregation is performed by summing multiple lines into an output accumulator register for the "y" direction and summing multiple shifts on a perimeter accumulating shift register for the "x" direction.

It will be noted that the TDI imaging sensor, which has been described in terms of sub-array 110, narrowband filter 210, analog CASC module 320, ADC and multiplexor module 340, and TDI module 360, is for a single wavelength channel in the hyperspectral imaging sensor 10. An actual hyperspectral imaging sensor comprises multiple replications of the channel described above, wherein the only difference between these replications is the central wavelength, and optionally bandwidth, of the channel's narrowband filter. This replication is illustrated in FIG. 2 and FIGS. 3A-B where detector sub-arrays 111, 112, etc. are identical to detector sub-array 110 and where the replicated electronic modules are all identical to their corresponding modules 320, 340, and 360. Narrowband filters 211, 212, and so on are similar to filter 210 in general design and construction but have been designed with different central wavelengths, and optionally bandwidth, to match the system designer's need for image spectral range and resolution.

Figure 6:
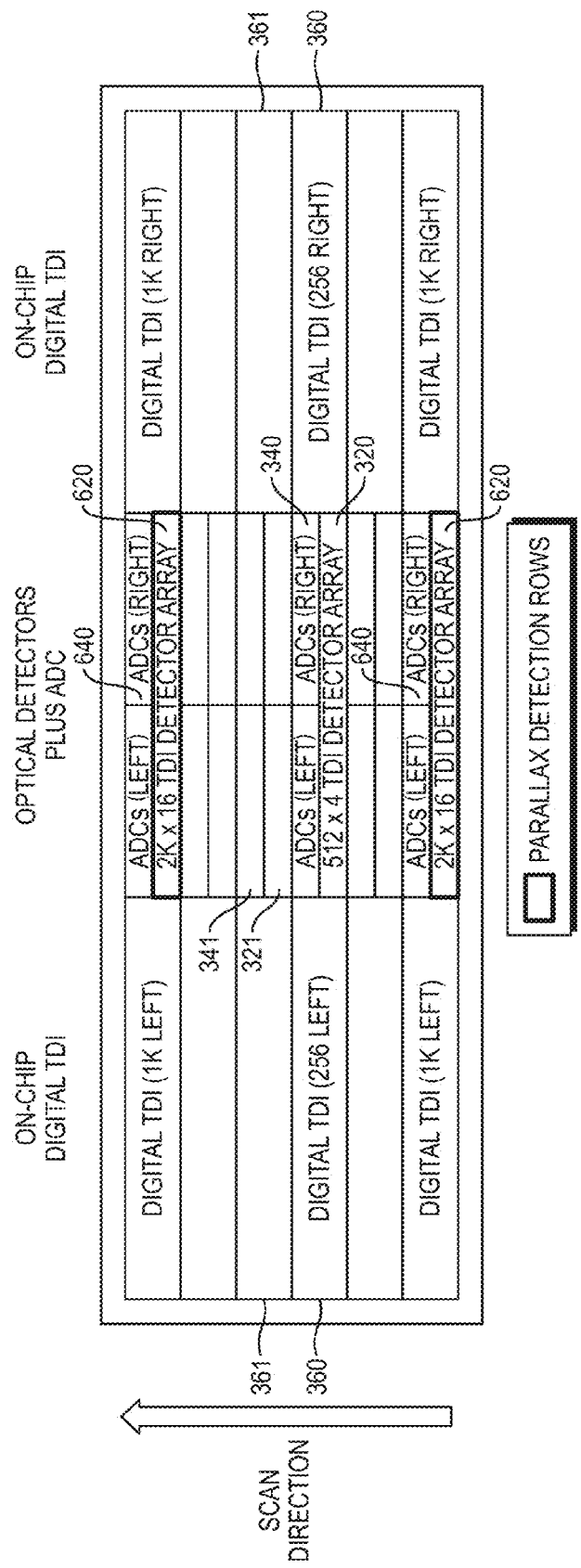
FIG. 6 is a plan view of the hyperspectral imaging sensor according to an embodiment.

FIG. 6 is a plan-view illustration of an embodiment hyperspectral imaging sensor 10 with 512×4 TDI detector sub-arrays 320 and 321 for hyperspectral imaging. ADCs 340 and 341 correspond to the detector sub-arrays 320 and 321, respectively, and each of the ADCs 340 and 341 has left and right portions. The embodiment of FIG. 6 also includes 2K×16 TDI detector arrays 620, at opposing sides of the sensor array, for detection of data for parallax determination. The embodiment of FIG. 6 also includes ADCs 640 corresponding to each of the TDI detector arrays 620.

It will also be understood that embodiment hyperspectral imaging sensors can be designed to operate over widely different spectral regions, with different spatial and spectral resolutions, with different spectral ranges, and with effective sensitivities by the system designer's selection of detector material, number of pixels in the cross-track direction, filter wavelength passband, number of sub-arrays, and number of pixels in the "TDI" along-track direction, respectively. Further, hyperspectral imaging sensors similar to the sensor of FIG. 6 can include two subsections, wherein the detector material in each subsection is selected to operate in different regions of the infrared spectrum, for example.

The embodiment of FIG. 6, for example, can be modified to have a dual-band configuration, wherein one subsection is designed to operate in the Long Wavelength Infrared (LWIR) and the other subsection is designed to operate in the Short or Mid-Wave Infrared (SWIR/MWIR). This can be done, for example, by adding an additional chip subsection similar to the subsection illustrated in the entirety of FIG. 6, the additional chip subsection being adjacent to the illustrated subsection along the scan direction. One subsection can be designed to operate at LWIR wavelengths, and the other subsection can be designed to be sensitive to SWIR/MWIR wavelengths. Furthermore, in some embodiments, each chip subsection includes a dedicated, respective pair of parallax detector arrays 620.

Table 1, below, presents example parameters that a designer might select for this dual-band configuration. Note that only 6 spectral channels per wavelength band are illustrated in FIG. 6 for the sake of clarity.

TABLE 1

Example Dual Band Hyperspectral Sensor Parameters

| Parameter | SWIR/MWIR | LWIR |
| --- | --- | --- |
| Number of Spectral Bands | 64 | 64 |
| Spectral bandwidth per channel | 20 nm | 80 nm |
| Linear array length (pixels) | 2048 | 512 |
| Stages of TDI | 16, 8 | 4 |
| Pixel aggregation | 1 × 1, 2 × 2 | 1 × 1, 2 × 2 |
| Physical pixel size | 12 µm | 48 µm |
| Active Imaging Area | 25 mm × 25 mm | 25 mm × 25 mm |

TABLE 1-continued

Example Dual Band Hyperspectral Sensor Parameters

| Parameter | SWIR/MWIR | LWIR |
|---|---|---|
| Physical chip size | 25 mm × 80 mm | 25 mm × 80 mm |
| Max Line-rate (lines/sec) | 1750 | 450 |
| Input Gain settings | 1x, 4x, 12x, 24x | 1x, 4x, 12x |
| 14-bit ADC | On-Chip | On-Chip |
| Digital TDI | On-Chip | On-Chip |

Striped Spectral Filter Assembly—As illustrated in FIG. 2, for example, striped spectral filter assembly 200 is mounted over the assembly of multiple 2-dimensional pixel sub-arrays 100. Spectral filter assembly 200 comprises a "butcher block" assembly containing, in one example embodiment, 64 individual narrow bandpass filters. The striped filters define the particular spectral bands for particular, corresponding sub-arrays or channels. Striped filters meeting system designers' typical requirements are known in the art.

Figure 7:
FIG. 7 illustrates typical striped filter assemblies.

FIG. 7 shows many examples of striped or checkerboard filters manufactured by Materion Barr Precision Optics and Thin Film Coatings, 2 Lyberty Way, Westford, Mass. 01886.

Electronic Processing—At its core, the hyperspectral imaging sensor 10 is an infrared staring array which operates at fast frame rates, for example 1750 frames per second in one example embodiment. The enabling technology for the sensor is the on-chip digital processing that implements the summation of signals from the appropriate detectors in synchronicity with the image scanning across the array. Previous design approaches to providing this on-chip processing, such as described by Tyrrell et al. in *Design Approaches for Digitally Dominated Active Pixel Sensors: Leveraging Moore's Law Scaling in Focal Plane Readout Design*, put most, if not all, of the digital processing electronics, including the ADC, Signal Accumulator/Counter, and multiplexor to transfer the digital count to adjacent pixels directly under each pixel. However, with current technology, it is not possible to fit all of the required digital processing under a 12 micron pixel, which is a useful pixel size for hyperspectral imaging sensor applications and infrared imaging applications in general. In most embodiments, the hyperspectral imaging sensor 10 overcomes this limitation in available space by moving the hybrid (analog plus digital) and purely digital processing elements out from under each pixel, leaving only the noise-sensitive analog processing there.

As discussed, the narrow spectral bands associated with hyperspectral sensing result in low signal levels and low photo-currents generated within each detector pixel. In the hyperspectral imaging sensor 10, each detector pixel has its own "micro" input circuit embedded underneath it to capture, collect, and hold the signal from that detector.

Figure 8:
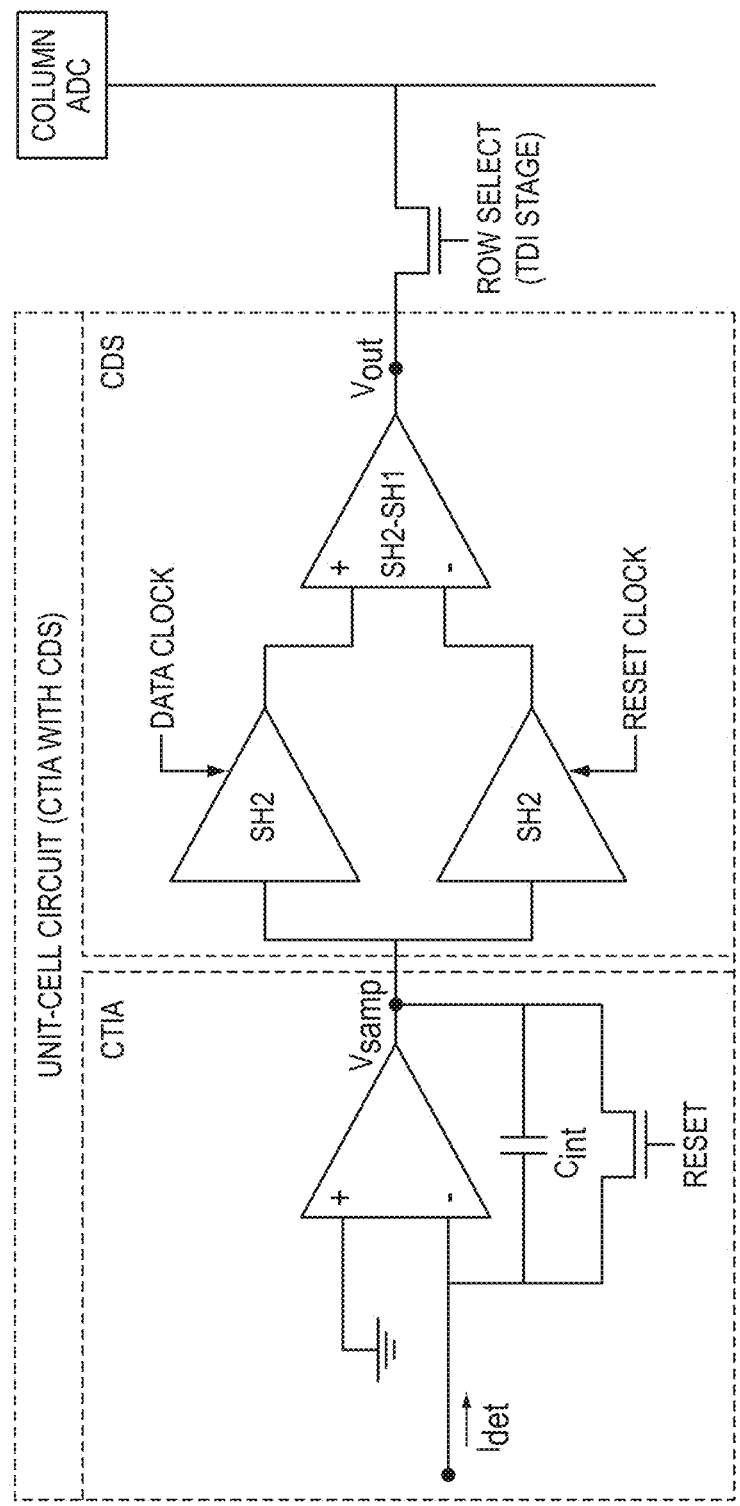
FIG. 8 is a block diagram of one implementation of an analog electronics unit cell.

FIG. 8 illustrates the analog input circuits contained within each pixel-sized unit cell. Specifically, a CTIA (Capacitive Transimpedance Amplifier) and a correlated double sampling circuit (CDS) are included in the unit cell. The CDS includes two sample and hold amplifiers. Each of these sub-circuits provide particular advantages for the hyperspectral application. The CTIA is aptly suited for signal integration at both low and high photocurrents.

The operation of the input circuit is as follows. The CTIA integrates the detector photocurrent (Idet) on the integration Capacitor Cint. Hyperspectral imaging sensor 10 provides four gain settings within the CTIA to handle a large dynamic range. Four integration capacitors of different sizes (not shown in figure) are individually selectable within the CTIA. The CTIA is reset every line time to start the exposure. This nominally zeroes out the charge on Cint at the beginning of each exposure time. However, this is a noisy process due to the thermodynamics of electron flow and a starting point of exactly zero charge is not achieved. Also, fixed voltage offsets from zero or slowly varying voltage offsets (known as 1/f noise) are also encountered. This creates a Fixed Pattern Noise (FPN) from one detector to another. Ideally, it is desirable to remove the reset noise and the FPN by subtracting the starting value at the beginning of each exposure from the final value at the end of each exposure. This is accomplished by adding a CDS circuit. The CDS measures the output voltage of the CTIA at the start of exposure time, i.e., just after reset, and then again at the end of the exposure time. Both values are sampled and held by amplifiers SH1 and SH2, as shown in FIG. 8. At the start of signal collection, the output voltage Vsamp is sampled and held in SH1 at each trigger of the reset clock. Similarly, at the end of signal collection, the output voltage Vsamp is sampled and held in SH2 at each trigger of the data clock. The reset voltage measured at the beginning of exposure is then subtracted from the signal voltage measured at the end of exposure by setting SH1 and SH2 as the inputs to a differential amplifier, thereby the noise on the starting voltage is removed from the output voltage (Vout.) Vout of each detector is accessed by a row select and placed on a column bus for subsequent ADC conversion.

An additional benefit of the sample and hold amplifiers is that by holding the voltage Vout for up to a full line-time, the full array can be readout while the next frame is collected. This provides an exposure time with close to 100% duty cycle, which is valuable for maximizing signal collection for hyperspectral applications.

Example Component Design Considerations

The hyperspectral line-scan imaging sensor illustrated in FIG. 1 through FIG. 6, as described above, is essentially a collection of narrow band, TDI imaging arrays (viz., spectral channels) distributed in the along-scan direction. The desired hyperspectral image is created by combining or overlaying, on a pixel-by-pixel basis, the images collected from the individual narrow band arrays. It is useful to overlay the spectral channels to sub-pixel accuracy to achieve high spatial resolution as well as the proper spectral signature associated with each spatial pixel. Since the spectral channels have been spatially separated to make room for the TDI, there are several effects that cause the various spectral images to become mis-registered.

Many of these effects can be mitigated with careful design and system calibration. For instance, the platform motion, such as aircraft motion, can induce line-of-sight jitter of the sensor, creating misregistration of the spectral channels relative to the other spectral channels as they are each acquired subsequently in time. There are commercial products available that utilize precision gyros, inertial navigation systems (INS), and Global Positioning System (GPS) devices to precisely measure the sensor's (x,y,z) position in space as well as the sensor's external angular orientation in pitch, roll, and yaw. These products provide measurements that are made synchronously with the exposure time of the sensor such that the sensor's position and angular orientation changes can be removed to sub-pixel accuracies. Additionally, any angular distortion induced by the lens can be carefully calibrated and removed, enabling accurate image registration. Accordingly, careful and precise system design and calibration can substantially remove the effects of line-of-sight motion and sensor based distortions.

However, there are image registration errors and image distortions that are not sensor- or motion-based but are fundamentally based upon the local height variations in the scene itself. The height and range variations in the scene create a localized "height dependent distortion" in the imagery known as optical parallax. In current practice, off-chip image post-processing is applied to register the individual spectral channels and mitigate effects such as geometric distortion and parallax. In embodiments of the current invention, this scene-based distortion of the imagery is substantially mitigated by the direct measurement of this distortion via the on-chip-parallax detection arrays. These parallax detection arrays can be, for example, cross-correlation arrays located on the leading and trailing edges of the array. Thus, embodiments of the invention can be thought of as performing "on-chip stereo imaging." Embodiment devices directly measure the parallax across the array, enabling accurate registration of the spectral bands spanning the array. In particular, it is not required or desired to provide large parallax angles, on the order of 40 degrees, typically associated with stereo mapping cameras. In this application, it is useful that the cross-correlation arrays be immediately adjacent to the hyperspectral arrays, rigidly mounted to the same chip, to ensure an accurate measurement of the scene-dependent distortion effect across the array.

For example, in many situations, the hyperspectral line-scan imaging sensor is used in cameras aboard aerial platforms where the camera is mounted on a stabilized pointing gimbal. Geometric distortion in the imagery arises due to the oblique, off-nadir viewing angles where the image plane is not parallel to the object plane, i.e., not parallel to the surface of the earth. In an ideal world, this geometric distortion, a phenomenon like the "bowtie" distortion shown in FIG. 10 can be calculated for projection onto an idealized spherical earth for instance, albeit with a fair amount of trigonometry and knowledge of the platform altitude and gimbal pointing angle. However, the real-world obviously does not have a perfectly spherical surface, and any deviation in scene height due to hills, valleys, buildings, etc. creates a local distortion in the imagery known as optical parallax.

Figure 9:
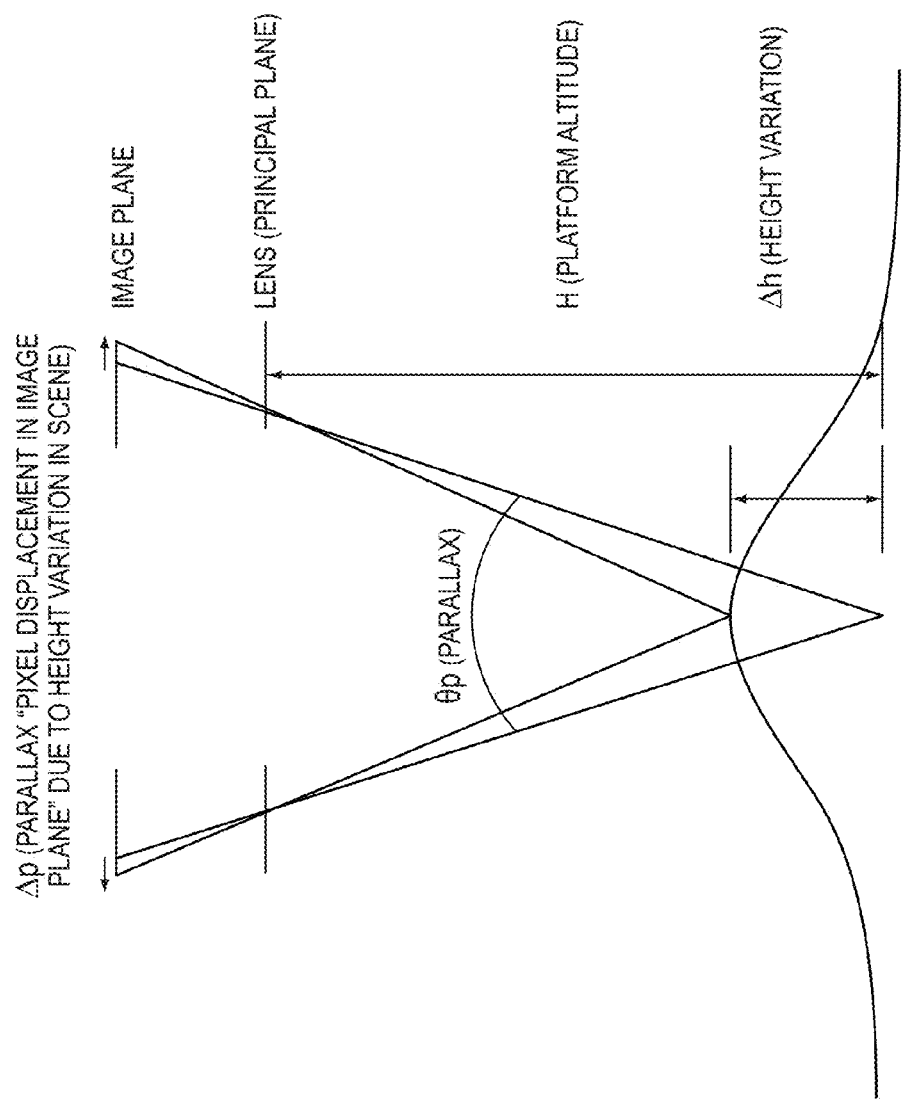
FIG. 9 illustrates optical parallax, creating lateral pixel displacement in an image, which is measured by cross-correlation arrays.

FIG. 9 illustrates that there is a lateral displacement of each point in the image that is dependent upon the height of the point in the scene. This height-based distortion can hinder the ability to register and overlap the individual spectral images to sub-pixel accuracy if not addressed. Accordingly, scene-based distortion measurements that need to be made in-flight include (a) optical parallax due to the local variations in terrain elevation and target height, and (b) residual errors in the calculation of the bowtie distortion due to the errors in knowledge of platform altitude, velocity, and sensor look-angle.

Accordingly, embodiments of the invention allow for measurement and correction of parallax distortion in hyperspectral images. While correction for parallax has previously been done off chip, embodiments of the invention include co-alignment circuitry configured to co-align image data from the sub-arrays of the 2D array to correct for the parallax on-chip.

Various techniques can be used to determine the correction for parallax. These methods can include cross-correlation of the values from the rows of parallax detecting elements, edge detection in the images from the parallax detecting elements, or image matching using values from the detector elements.

Figure 10:
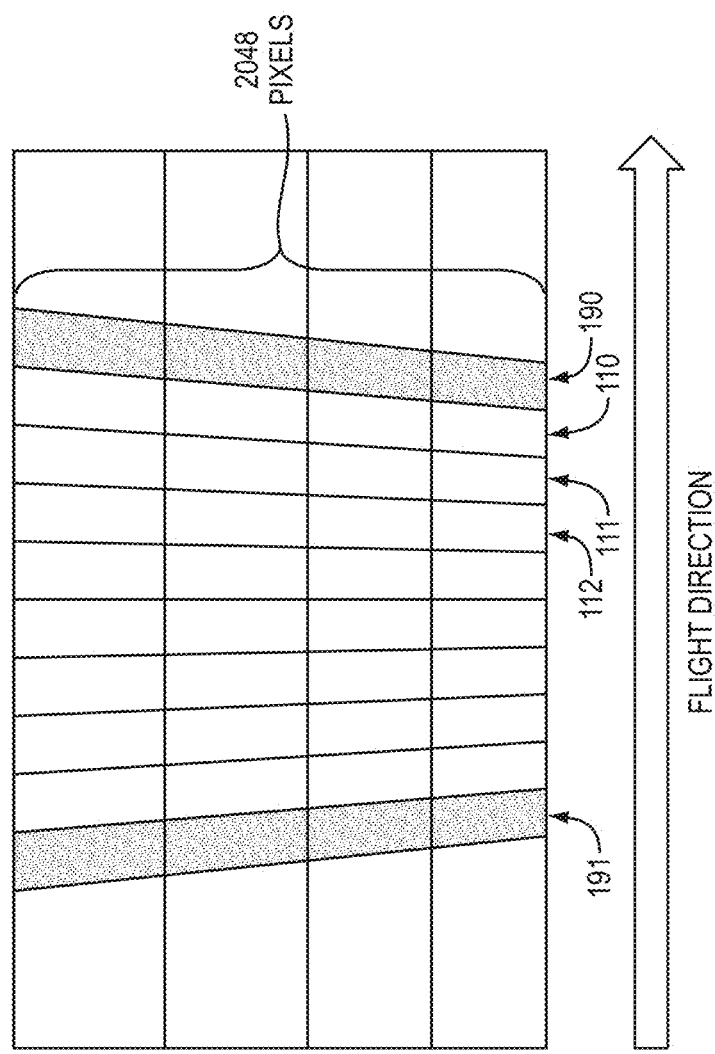
FIG. 10 illustrates geometric distortion of individual arrays as projected onto the earth and which is measured by pair of cross-correlation arrays.

FIG. 10 illustrates the "footprint" of detector arrays 100 when they are projected outwardly to the ground from a camera on an airborne platform. As shown in FIG. 10, a variation of the hyperspectral line-scan imaging sensor further comprises a pair of cross-correlation arrays 190, 191. Cross-correlation arrays 190, 191 are high resolution, high-signal TDI arrays operating over a broad spectral band. Functionally they are equivalent to any of the other arrays (and support electronics) in the sensor, array 110 for example. In some embodiments they may be identical to the other detector arrays while in other embodiments, where higher levels of correlation performance are desired, cross-correlation arrays 190, 191 may be designed with smaller pixels and/or wider spectral bandwidths and/or shorter wavelength bands than the other arrays.

As shown in the figure, the cross-correlation arrays are preferably disposed at the beginning and the end of the image scan (that is, before the first spectral channel, say array 110 in FIG. 2, and after the last spectral channel, not illustrated in FIG. 2), where the distortion effects are most pronounced. The two images produced by these arrays are cross-correlated (i.e., mathematically "overlapped" and compared). It will be noted that the amount of pixel shift scales directly with the location of the individual spectral channels on the chip. Accordingly, the on-chip distortion and parallax measurement produced by the two outer cross-correlation arrays provides a direct measurement of the parameters necessary to pull all of the inner channels back together. The very small difference in viewing angle between the two cross-correlation arrays (e.g., typically on the order of 10 degrees or much less) as well as having them both physically located on the same chip makes for near identical viewing conditions, which improves the accuracy of the cross-correlation. The details of cross-correlation of image data are understood in the art.

As described above, in some variations the hyperspectral line-scan imaging sensor comprises two sections, one for short/mid-wavelength IR imaging and one for long-wavelength IR imaging. Typically, embodiments of this variation have a pair of cross-correlation arrays for each section. The cross-correlation arrays may have the same pixel pitch as the hyperspectral channels or may be higher spatial resolution with smaller pixel pitch and/or shorter wavelength band to further aid in the registration accuracy of the hyperspectral channels.

Figure 11A:
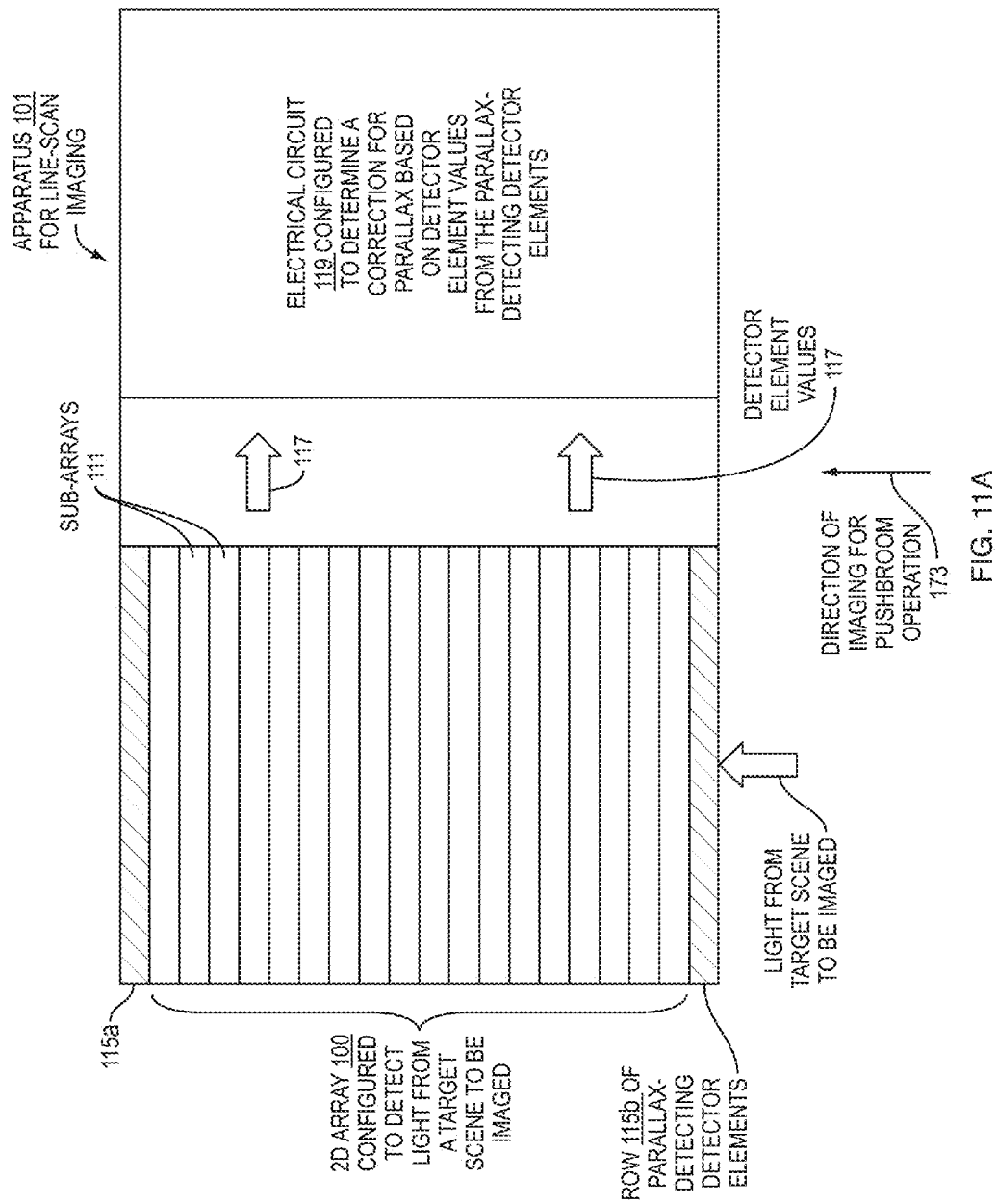
FIG. 11A is a schematic block diagram of an apparatus for line-scan imaging according to an embodiment of the invention.

FIG. 11A is a schematic block diagram illustrating the apparatus 101 for line scan imaging. The apparatus includes a 2D array 100 of light-sensitive detector elements configured to detect light from a target scene to be imaged. The 2D array 100 is divided into a plurality of sub-arrays 111. In particular, the sub-arrays 111 can include one or more rows of the 2D array 100. Adjacent to the 2D array 100 are two rows of parallax detecting detector elements 115A and 115B. The apparatus 101 also includes an electrical circuit 119 configured to determine a correction for parallax based on detector element values 117 from the two rows 115A and 115B of parallax detecting elements. The correction for parallax that is determined enables images captured by the sub-arrays 111 to be co-aligned with each other. Such a co-alignment can remove the effects of parallax distortion, for example, allowing images from the different sub-arrays 111 to be appropriately overlapped to form an overall image with less distortion. An arrow 173 indicates a direction of motion of the 2D array 100 with respect to the target scene to be imaged, the direction 173 being indicated for pushbroom operation of the 2D array 100. Note that for whiskbroom operation of the 2D array 100, the motion direction of the 2D array with respect to the scene is perpendicular to the direction 173.

In some embodiments of the apparatus 101, the electrical circuit 119 comprises a processor configured to execute software or firmware to co-align the images captured by the sub-arrays 111 with each other as a function of the correction for parallax.

The sub-arrays 111 in FIG. 11A are shown as single rows of pixels of the 2D array 100. However, it should be noted that, as shown in FIGS. 2 and 3, for example, each sub-array 111 can comprise multiple rows of the 2D array 100. While individual pixels in each sub-array 111 are not shown in FIG. 11A, the individual pixels are shown in FIGS. 2 and 3, for example. The individual pixels have a pitch, or separation between them, as indicated in FIG. 3. In some embodiments, a pitch of the parallax detecting elements (not shown) and a pitch of the detector elements of the 2D array can have respective pitches that are different. In some cases, for example, the pitch of the parallax detecting elements can be at least two times smaller than the pitch of the detector elements of the 2D array. In other embodiments, the pitch of the parallax detecting elements can be at least 4 times or at least 10 times smaller than the pitching of the detector elements of the 2D array, for example. The smaller pitch between pixels of the parallax detecting elements can increase resolution of the parallax correction.

As illustrated in FIGS. 1 and 2, the light reaching each sub-array can be filtered by a different optical filter to allow a different wavelength to reach the sub-array. These filters can be narrowband filters when filtering light to be detected by the 2D array for hyperspectral imaging. In some embodiments, broadband filters are configured to filter the light to be received at the rows of parallax detecting elements. This allows, for example, more light to be received at the parallax detecting elements. Furthermore, the parallax detecting elements and the light-sensitive elements of the 2D array can be configured to detect wavelengths in different wavelength bands. For example, where a 2D array of light-sensitive detector elements are configured to detect long wavelength IR wavelengths for hyperspectral imaging, the parallax detecting elements can be configured to detect light in the near IR and/or mid-IR ranges, and smaller wavelengths increase resolution of the parallax detection and correction. It should be noted that in other embodiments of the apparatus 101, the light-sensitive detector elements and parallax detecting elements can be configured, in conjunction with filters, to detect wavelengths other than infrared wavelengths, such as visible wavelengths, for example.

The sub-arrays 111 and parallax detecting elements 115A and B can be situated in a common plane on a single chip, as illustrated in FIG. 11A and FIGS. 2 and 3A-B, for example. This common plane configuration has the advantage of increasing the possible resolution for determination and correction of parallax. A further advantage of embodiments of the invention is that the at least two sets of parallax detecting elements can be situated at opposing sides of the 2D array 100, as illustrated in FIG. 11A. The opposing sides are situated at leading and trailing edges of the 2D array 100 to increase resolution of the parallax determination and correction. Since the parallax error is proportional to the displacement between the two rows of parallax detecting elements, the parallax can be determined with higher resolution in this configuration. However, in other embodiments, a parallax determination and correction can also be made where row 115a is located, is defined by the direction 173 of the motion of the apparatus 101. Similarly, the trailing edge, where row 115b is located, is determined based on the direction of motion. Thus, for a push broom mode of operation, the orientation is of the rows 115a and 115b, and the sub-arrays 111 is perpendicular to the direction of motion of the platform on which the apparatus 101 is mounted. Thus, for an airborne or spaceborne application, for example, the apparatus 101 is oriented so that the rows are perpendicular to the direction of motion of the airborne or spaceborne platform.

FIGS. 11B-E illustrate variations of the 2D array 100 illustrated in FIG. 11A. In particular, FIG. 11A illustrates how the rows 115a and 115b of parallax detecting elements can be separate linear arrays of detector elements. In some embodiments, such as the one shown in FIG. 11B, there is a mechanical gap separating the rows of parallax detecting elements from the 2D array. However, in other embodiments, the parallax detecting elements can be immediately adjacent to sub-arrays 111 of the 2D array 100.

FIG. 11C illustrates that the rows of parallax detecting elements 115a to 115b can be respective sub-arrays of the 2D array 100. In other words, the rows of parallax elements can be a corresponding number of the plurality of sub-arrays.

FIG. 11B illustrates that some embodiments of apparatus 101 can include more than two rows of parallax detecting elements. As illustrated in FIG. 11D, both rows 115a and 115b are located at the leading and trailing edges of the 2D array, respectively, but the 2D array in FIG. 11D also includes a third row 115c of parallax detecting elements. The additional row can be used to perform additional cross-correlation calculations between different pairs of the parallax detecting elements 115a to c, and this can be useful for increasing resolution or redundancy of the parallax measurements. The third row of parallax detecting elements 115c in FIG. 11D is oriented along a centerline of the 2D array 100, and the centerline is nominally perpendicular to the direction of forward motion of the apparatus with respect to the scene to be imaged. In the case of FIG. 11D, the centerline of the 2D array is nominally perpendicular to the arrow 173, which is the direction of motion for pushbroom operation of the arrays in FIGS. 11B to E.

FIG. 11E illustrates that two additional rows of parallax detecting elements, 115E and 115F, can be located at additional opposing sides of the 2D array 100. Thus, in the embodiment of FIG. 11E, each of the four sides of the 2D array 100 includes an adjacent row of parallax detecting elements.

Figure 12:
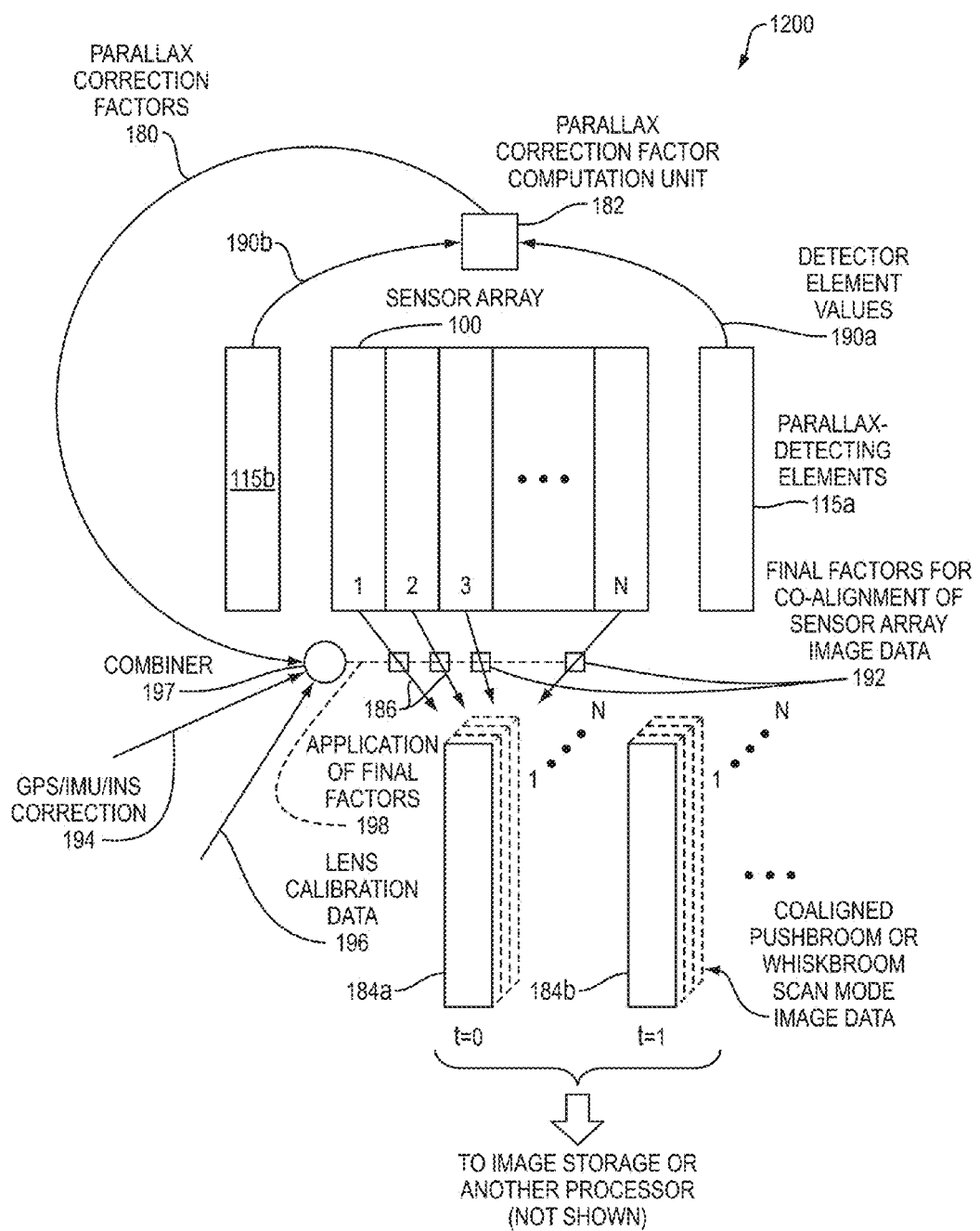
FIG. 12 is a schematic block diagram of an embodiment hyperspectral imaging sensor with indications of processing operations, used to correct for distortion caused by parallax, to co-align imaging data of subsets of imaging elements within the sensor.

FIG. 12 is a schematic block diagram of an embodiment apparatus 1200 for line scan imaging that includes the hyperspectral imaging capability. FIG. 12 also includes indications of processing operations used to correct for distortion caused by parallax to co-align imaging data of subsets (sub-arrays) of imaging elements within the sensor. The sensor array 100 is divided into sub-arrays 1, 2, 3, . . . N and the sub-arrays are similar to the sub-arrays 110, 111, 112, and so forth illustrated in FIGS. 2 and 3B, for example. The apparatus 1200 also includes two rows of parallax detecting elements 115a and 115b located in a common plane on a common substrate chip with the sensor array 100. Each of the sub-arrays 1, 2, 3, . . . N detects light over a narrow band of wavelengths, as described herein above and is accomplished using narrowband filters such as the narrowband filters 210, 211, 212, etc. illustrated in FIG. 2. With the sensor array 100 providing image data over different wavelength bands, data from the different sub-arrays can be combined or overlapped to produce hyperspectral images.

In the presence of parallax distortion, image data from the different sub-arrays 1, 2, 3 . . . N can be co-aligned to remove parallax distortion. Image data from parallax detecting elements 115a and 115b are analyzed at a parallax correction factor computation unit 182. The unit 182 can include a computer or other processor running software or firmware configured to determine a correction for parallax to apply it to co-align the hyperspectral imaging data. The computation of parallax correction factors can include cross correlating detector element values (image data) 190a and 190b received from the elements 115a and 115b, respectively. Determining the parallax correction can also include other methods known in the art, such as edge detection and image matching. The parallax correction unit 182 provides parallax correction factors 180, which are applied to image data from individual sub-arrays 1, 2, 3, . . . N.

The embodiment of FIG. 12 is further configured to optionally correct for temporal pointing errors measured by a GPS, INS, or IMU system or an integrated combination thereof. This correction is indicated as an arrow 194 input to an optional correction combiner 197. The embodiment of FIG. 12 is also configured to correct for lens distortion using lens calibration data, which is indicated as an arrow 196 input to the correction combiner 197. Lens distortion can arise from an imaging lens (not shown) of the apparatus 1200, for example.

The combiner 197 combines parallax correction factors 180, the GPS/IMU/INS correction 194, and the lens calibration correction data 196 to produce final factors 192 for co-alignment of the sensor array image data. A dashed line 198 indicates application of final factors 192 to image data from individual sub-arrays to produce co-aligned hyperspectral image data 184a at time T=0. Similarly, at a different T=1, image data are again combined and corrected based on updated parallax correction factors 180 to produce a co-aligned hyperspectral image 184b at time T=1. The co-aligned hyperspectral images 184a and 184b can then be sent to the image storage or another processor (not shown) for further processing.

It should be pointed out that applying the parallax correction factors 180 to image data from the individual sub-arrays can be performed in the parallax computation unit 182 or in a separate processor (not shown), as needed. The functions of combiner 197 can also be performed by parallax computation unit 182 or another processor, for example. The parallax correction factor computation unit 182 can thus form part of an electrical circuit configured to determine the correction for parallax based on the detector element values from two or more rows of parallax detecting elements to enable images captured by the sensor array 100 to be co-aligned with each other. In FIG. 11A, for example, the electrical circuit 119 is configured to perform these functions. Further, as already noted, the parallax correction factors 180 can be applied by the parallax correction unit 182 or by separate co-alignment circuitry configured to co-align the image data from the sub-arrays to correct for the parallax. The co-alignment circuitry can include, as already noted, a separate processor (not shown). The computation unit 182, combiner 197, and any other processor (not shown) can form part of the electrical circuit 119 illustrated in FIG. 11A.

It will be understood that the above-described features of the embodiments of the invention include various novel details of construction and combinations of parts, and other advantages, and the particular methods and/or device embodying the embodiments are shown by way of illustration and not as a limitation of the embodiments. The principles and features of the embodiments may be employed in various and numerous embodiments without departing from the scope of the embodiments of the invention.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. An apparatus for line-scan imaging, the apparatus comprising:
 a single 2D array of light-sensitive detector elements configured to detect light from a target scene with 3D topography to be imaged, the 2D array divided into a plurality of sub-arrays, each of the sub-arrays being a line-scan imager; and
 an electrical circuit configured to determine a correction for range-dependent parallax on a detector element-by-detector element basis based on detector element values from at least two rows of parallax detecting detector elements from among the single 2D array to enable images captured by the sub-arrays to be co-aligned with each other.

2. The apparatus of claim 1, further comprising co-alignment circuitry configured to co-align image data from the sub-arrays to correct for the parallax.

3. The apparatus of claim 1, wherein the parallax is further due to a height dependent distortion.

4. The apparatus of claim 1, wherein the parallax detecting elements and the detector elements of the 2D array have respective pitches, and wherein the pitch of the parallax detecting elements is at least two times smaller than the pitch of the detector elements of the 2D array.

5. The apparatus of claim 1, wherein the electrical circuit comprises a processor configured to execute software or firmware to co-align the images captured by the sub-arrays with each other as a function of the correction for parallax.

6. The apparatus of claim 1, wherein the electrical circuit is further configured to determine topographical features of the target scene as a function of the parallax.

7. The apparatus of claim 1, wherein the electrical circuit is further configured to determine the correction for parallax by at least one of cross-correlation, edge detection, or image matching using the detector element values.

8. The apparatus of claim 1, wherein the electrical circuit is further configured to correct for temporal pointing errors measured by an IMU system.

9. The apparatus of claim 1, wherein the electrical circuit is further configured to correct for lens distortion using lens calibration data.

10. The apparatus of claim 1, wherein the at least two rows of parallax detecting elements are situated at opposing sides of the 2D array, the opposing sides situated at or near leading and trailing edges of the 2D array.

11. The apparatus of claim 1, wherein the 2D array is configured to be utilized in a pushbroom or whiskbroom scanning mode.

12. The apparatus of claim 1, wherein the 2D array is configured to obtain hyperspectral images of the target scene, the apparatus further comprising a plurality of respective, narrowband, optical filter assemblies, each assembly comprising one or more narrowband, optical filters mounted between the target scene and a respective sub-array.

13. The apparatus of claim 1, wherein the electrical circuit is configured to determine the correction for parallax based on detector values from at least three rows of parallax detecting detector elements, and wherein one of the at least three rows is oriented along a centerline of the 2D array, the centerline nominally perpendicular to a direction of forward motion of the apparatus with respect to the scene to be imaged.

14. The apparatus of claim 1, wherein the apparatus further comprising at least two broadband optical filters disposed optically coupled to the parallax detecting elements.

15. The apparatus of claim 1, wherein the at least two rows of parallax detecting elements are a corresponding number of the plurality of sub-arrays.

16. The apparatus of claim 1, further comprising a readout integrated circuit (ROIC) in individual electrical communication with the detector elements of the 2D array.

17. The apparatus of claim 1, wherein the parallax detecting elements are configured to detect wavelengths in a band of shorter wavelengths than the 2D array is configured to detect.

18. The apparatus of claim 1, wherein the parallax detecting elements and the elements of the 2D array are configured to detect light from different respective wavelength bands, the wavelength band corresponding to the parallax detecting elements including shorter wavelengths than the wavelength band corresponding to the elements of the 2D array.

19. The apparatus of claim 1, wherein the 2D array of light-sensitive detector elements and the parallax detecting elements are configured to detect light over respective spectral bandwidths, and wherein the spectral bandwidth over which the parallax detecting elements are configured to detect light is wider than the spectral bandwidth over which the light-sensitive detector elements of the 2D array are configured to be sensitive.

20. The apparatus of claim 1, wherein the 2D array of light-sensitive detector elements are sensitive to infrared light.

21. The apparatus of claim 1, wherein the at least two rows of parallax detecting detector elements are perpendicular to a scan direction of the 2D array.

22. The apparatus of claim 1, further including an imaging lens, and wherein the 2D array of light-sensitive detector elements and the at least two rows of parallax detecting detector elements are both arranged to receive light from the target scene through the imaging lens.

23. The apparatus of claim 10, wherein the opposing sides of the 2D array are first opposing sides, the apparatus further comprising two additional rows of parallax-detecting detector elements situated at additional opposing sides of the 2D array.

24. The apparatus of claim 12, wherein the plurality of optical filter assemblies comprises, either (i) a plurality of optical filter coatings coated onto a single substrate, or (ii) a plurality of individual spectral filters assembled into a single filter assembly.

25. The apparatus of claim 16, wherein the ROIC includes an analog amplification and signal conditioning electrical circuit module, the module comprising one or more replicated amplification and signal conditioning circuits in one-to-one electrical communication with the detector elements.

26. The apparatus of claim 25, further comprising an analog-to-digital conversion electrical circuit module disposed in the ROIC physically adjacent to the analog amplification and signal conditioning electrical circuit module and in a portion of the substrate not supporting the 2D array.

27. The apparatus of claim 16, further comprising one or more digital Time-Delay and Integration (TDI) modules disposed in the ROIC in a portion of the substrate not supporting the 2D array.

28. A method of line-scan imaging, the method comprising:
    detecting light, at a single 2D array of light-sensitive detector elements divided into a plurality of sub-arrays, from a target scene with 3D topography to be imaged, including using each of the sub-arrays as a line-scan imager; and
    determining a range-dependent correction for parallax on a detector element-by-detector element basis to apply to co-align data from the sub-arrays, the correction based on detector element values from at least two rows of parallax detecting detector elements from among the single 2D array.

29. The method of claim 28, further comprising co-aligning the image data from the sub-arrays to correct for the parallax.

30. The method of claim 28, wherein determining the correction for parallax further includes determining a correction for height dependent distortion.

31. The method of claim 28, wherein determining the correction for parallax includes determining the correction based on detector element values from parallax detecting elements having a pitch at least two times smaller than a pitch of the light-sensitive detector elements of the 2D array.

32. The method of claim 28, further comprising executing software or firmware to co-align the images captured by the sub-arrays with each other as a function of the correction for parallax.

33. The method of claim 28, further comprising determining topographical features of the target scene as a function of the parallax.

34. The method of claim 28, wherein determining the correction for parallax includes employing cross-correlation, edge detection, or image matching using the detector element values.

35. The method of claim 28, further comprising correcting for temporal pointing errors measured by an IMU system.

36. The method of claim 28, further comprising correcting for lens distortion using lens calibration data.

37. The method of claim 28, wherein determining the correction for parallax includes basing the correction on detector element values from at least two rows of parallax detecting elements situated at opposing sides of the 2D array, the opposing sides situated at or near leading and trailing edges of the 2D array.

38. The method of claim 28, wherein detecting the light at the 2D array of light-sensitive detector elements includes utilizing the 2D array in a pushbroom or whiskbroom scanning mode.

39. The method of claim 28, wherein detecting light at the 2D array of light-sensitive detector elements includes filtering the light at a plurality of respective, narrowband, optical filter assemblies, each assembly comprising one or more narrowband, optical filters mounted between the target scene and a respective sub-array.

40. The method of claim 28, wherein determining the correction for parallax includes basing the correction on detector element values from at least three rows of parallax detecting elements, one of the at least three rows oriented along a centerline of the 2D array, the centerline nominally perpendicular to a direction of forward motion of the apparatus with respect to the scene to be imaged.

41. The method of claim 28, wherein determining the correction for parallax includes basing the correction on detector element values from the at least two rows of parallax detecting detector elements with broadband optical filters disposed optically coupled to the parallax detecting elements.

42. The method of claim 28, wherein determining the correction for parallax based on detector element values from at least two rows of parallax detecting elements includes using detector element values from a corresponding number of the plurality of sub-arrays.

43. The method of claim 28, further comprising electrically communicating detector values from the 2D array to a readout integrated circuit (ROIC) in individual electrical communication with the detector elements of the 2D array.

44. The method of claim 28, wherein determining the correction for parallax includes detecting wavelengths at the parallax detecting elements in a band of shorter wavelengths than the 2D array is configured to detect.

45. The method of claim 28, wherein determining the correction for parallax includes detecting light at the parallax detecting elements with a wavelength band including shorter wavelengths than a wavelength band at which the detector elements of the 2D array are configured to detect.

46. The method of claim 28, wherein determining the correction for parallax includes detecting light at the parallax detecting elements over a spectral bandwidth that is wider than a spectral bandwidth over which the detector elements of the 2D array are configured to be sensitive.

47. The method of claim 28, wherein detecting light at the 2D array of light-sensitive detector elements includes detecting infrared light.

48. The method of claim 28, wherein determining a correction for parallax based on the at least two rows of parallax detecting detector elements includes using rows of parallax detecting detector elements oriented perpendicular to a scan direction of the 2D array.

49. The method of claim 28, further including receiving light from the target scene at the 2D array of light-sensitive detector elements and at the at least two rows of parallax detecting detector elements through a common imaging lens.

50. The method of claim 37, wherein determining the correction for parallax further comprises basing the correction on detector element values from two additional rows of parallax detecting detector elements situated at additional opposing sides of the 2D array.

51. The method of claim 39, wherein the plurality of optical filter assemblies comprises either (i) a plurality of optical filter coatings coated onto a single substrate, or (ii) a plurality of individual spectral filters assembled into a single filter assembly.

52. The method of claim 43, wherein communicating the detector element values to the ROIC includes communicating the values to an analog amplification and signal conditioning electrical circuit module comprising one or more replicated amplification and signal conditioning circuits in one-to-one electrical communication with the detector elements.

53. The method of claim 52, further comprising communicating values from the analog amplification and signal conditioning module to an analog-to-digital conversion electrical circuit module disposed in the ROIC physically adjacent to the analog amplification and signal conditioning electrical circuit module and in a portion of the substrate not supporting the 2D array.

54. The method of claim 53, further comprising electrically communicating values from the analog-to-digital module to one or more digital time delay and integration (TDI) modules disposed in the ROIC in a portion of the substrate not supporting the 2D array.

55. An apparatus for line-scan imaging, the apparatus comprising:
on a chip, means for detecting light, from a target scene with 3D topography to be imaged, to produce data representing the target scene, using a single 2D array of light-sensitive elements, the 2D array divided into a plurality of sub-arrays, each of the sub-arrays being a line-scan imager; and
on the chip, means for detecting parallax to use to determine range-dependent parallax corrections on a detector element-by-detector element basis to apply to co-align the data representing the target scene, the means for detecting parallax including at least two rows of parallax-detecting detector elements from among the single 2D array.

56. An apparatus for line-scan imaging, the apparatus comprising:
a single 2D line-scanning array of light-sensitive detector elements configured to detect light from a target scene with 3D topography to be imaged, the 2D array being divided into a plurality of parallel sub-arrays;
at least two rows of parallax detecting detector elements, the at least two rows parallel to the sub-arrays and near leading and trailing edges of the 2D line-scanning array; and
an electrical circuit configured to determine a correction for range-dependent parallax on a detector element-by-detector element basis based on detector element values from the at least two rows of parallax detecting detector elements to enable sequentially scanned images captured by the sub-arrays to be co-registered with each other.

* * * * *